(12) United States Patent
Moon et al.

(10) Patent No.: US 11,889,731 B2
(45) Date of Patent: *Jan. 30, 2024

(54) DISPLAY APPARATUS

(71) Applicant: SAMSUNG DISPLAY CO., LTD., Yongin-si (KR)

(72) Inventors: Joongsoo Moon, Yongin-si (KR); Wonkyu Kwak, Yongin-si (KR); Kwangmin Kim, Yongin-si (KR); Kiwook Kim, Yongin-si (KR); Dongsoo Kim, Yongin-si (KR); Hyunae Park, Yongin-si (KR); Jieun Lee, Yongin-si (KR); Changkyu Jin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/878,437

(22) Filed: Aug. 1, 2022

(65) Prior Publication Data
US 2022/0367600 A1 Nov. 17, 2022

Related U.S. Application Data

(60) Continuation of application No. 17/034,408, filed on Sep. 28, 2020, now Pat. No. 11,411,067, which is a (Continued)

(30) Foreign Application Priority Data

Mar. 31, 2017 (KR) ......................... 10-2017-0041932

(51) Int. Cl.
*H10K 59/131* (2023.01)
*H01L 27/12* (2006.01)
(Continued)

(52) U.S. Cl.
CPC ....... *H10K 59/131* (2023.02); *H01L 27/1218* (2013.01); *H01L 27/1244* (2013.01);
(Continued)

(58) Field of Classification Search
None
See application file for complete search history.

(56) References Cited

U.S. PATENT DOCUMENTS 9,356,087 B1 5/2016 Lee et al.
10,686,025 B2 * 6/2020 Oh ..................... H10K 59/1213
(Continued)

FOREIGN PATENT DOCUMENTS

CN 106129061 A 11/2016
EP 2814074 A1 12/2014
(Continued)

OTHER PUBLICATIONS

Korean Office Action for Application No. 10-2017-0041932 dated Jun. 21, 2021.
(Continued)

*Primary Examiner* — Michelle Mandala
(74) *Attorney, Agent, or Firm* — CANTOR COLBURN LLP

(57) ABSTRACT

A display apparatus includes: a substrate having a bending area between a first area and a second area; internal conductive lines on the substrate in the first area; external conductive lines on the substrate in the second area; an organic material layer covering the bending area and covering at least a portion of the internal conductive lines and the external conductive lines; and connection lines on the organic material layer and connecting the internal conductive lines to the external conductive lines, respectively. Organic through-holes are defined through the organic material layer, the connection lines are respectively connected to
(Continued)

the internal conductive lines through the organic through-holes, and an upper surface of the organic material layer between the organic through-holes has a convex curved shape.

15 Claims, 16 Drawing Sheets

Related U.S. Application Data continuation of application No. 16/777,069, filed on Jan. 30, 2020, now Pat. No. 10,790,350, which is a division of application No. 15/903,480, filed on Feb. 23, 2018, now Pat. No. 10,586,841.

(51) Int. Cl.
*H10K 59/124* (2023.01)
*H10K 59/121* (2023.01)
*H10K 77/10* (2023.01)
*H01L 49/02* (2006.01)
*H10K 50/844* (2023.01)
*H10K 59/122* (2023.01)
*H10K 59/123* (2023.01)
*H10K 102/00* (2023.01)

(52) U.S. Cl.
CPC ...... *H01L 27/1248* (2013.01); *H01L 27/1255* (2013.01); *H10K 59/124* (2023.02); *H10K 59/1213* (2023.02); *H10K 59/1216* (2023.02); *H10K 77/111* (2023.02); *H01L 27/124* (2013.01); *H01L 28/60* (2013.01); *H10K 50/844* (2023.02); *H10K 59/122* (2023.02); *H10K 59/123* (2023.02); *H10K 2102/311* (2023.02); *Y02E 10/549* (2013.01)

(56) References Cited

U.S. PATENT DOCUMENTS

| | | | |
|---|---|---|---|
| 11,411,067 B2* | 8/2022 | Moon | H10K 59/124 |
| 2014/0054794 A1 | 2/2014 | Gopalan et al. | |
| 2014/0217397 A1 | 8/2014 | Kwak et al. | |
| 2015/0380679 A1 | 12/2015 | Fujiyoshi et al. | |
| 2016/0043153 A1 | 2/2016 | Min | |
| 2016/0179229 A1* | 6/2016 | Ahn | G06F 3/0447 345/173 |
| 2016/0181345 A1 | 6/2016 | Lee et al. | |
| 2016/0260915 A1 | 9/2016 | Park et al. | |
| 2016/0329391 A1 | 11/2016 | Ko et al. | |
| 2017/0012056 A1 | 1/2017 | Lee | |
| 2017/0077447 A1 | 3/2017 | Kang et al. | |
| 2017/0125505 A1* | 5/2017 | Oh | H10K 59/131 |
| 2017/0170206 A1 | 6/2017 | Lee et al. | |
| 2018/0053905 A1 | 2/2018 | Lee et al. | |

FOREIGN PATENT DOCUMENTS

| | | |
|---|---|---|
| EP | 2840460 A1 | 2/2015 |
| KR | 1020140099139 A | 8/2014 |
| KR | 1020140116990 A | 10/2014 |
| KR | 1020140129647 A | 11/2014 |
| KR | 1020160000846 A | 1/2016 |
| KR | 1020170007649 A | 1/2017 |
| KR | 1020170032955 A | 3/2017 |

OTHER PUBLICATIONS

Extended European Search Report for Application No. 18164518.5 dated Jan. 16, 2019.
Partial European Search Report for Application No. 18164518.5 dated Aug. 24, 2018.

* cited by examiner

DISPLAY APPARATUS

This application is a continuation of U.S. patent application Ser. No. 17/034,408, filed on Sep. 28, 2020, which is a continuation of U.S. patent application Ser. No. 16/777,069, filed on Jan. 30, 2020, which is a divisional of U.S. patent application Ser. No. 15/903,480, filed on Feb. 23, 2018, which claims priority to Korean Patent Application No. 10-2017-0041932, filed on Mar. 31, 2017, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus in which occurrence of defects such as broken wiring therein is reduced.

2. Description of the Related Art

A display apparatus is an apparatus for visually displaying an image corresponding to image data applied thereto. The display apparatus includes a substrate divided into a display area and a non-display area. In the display area, gate lines and data lines are insulated from each other, and a plurality of pixel areas are defined by intersections of the gate lines and the data lines. Also, in the display area, thin film transistors ("TFT"s) and pixel electrodes electrically connected to the TFTs are provided to correspond to the pixel areas. In the non-display area, various conductive lines for transmitting electrical signals to the display area are arranged.

At least a portion of the display apparatus may be bent to enhance visibility from various angles or decrease the size of the non-display area. Various techniques are being developed for reducing defects and saving costs during the manufacturing process of a display apparatus in a bent shape.

SUMMARY

One or more embodiments include a display apparatus in which an interval between conductive lines in the display apparatus may be reduced and an occurrence of defects such as short-circuits of the conductive lines may be reduced.

According to one or more embodiments, a display apparatus includes: a substrate on which a first area, a second area, and a bending area between the first area and the second area are defined, wherein the substrate is bent around a bending axis extending in a first direction; a plurality of internal conductive lines on the substrate in the first area; a plurality of external conductive lines on the substrate in the second area; an organic material layer covering the bending area and covering at least a portion of the plurality of internal conductive lines and the plurality of external conductive lines; and a plurality of connection lines on the organic material layer and connecting the plurality of internal conductive lines to the plurality of external conductive lines, respectively. In such embodiments; a plurality of organic through-holes is defined through the organic material layer, the plurality of connection lines are respectively connected to the plurality of internal conductive lines through the plurality of organic through-holes, the plurality of organic through-holes include a plurality of first organic through-holes arranged in the first direction, and an upper surface of the organic material layer arranged between the plurality of first organic through-holes has a convex curved shape.

In an embodiment, a portion of each of the plurality of connection lines may be on the organic material layer between the plurality of first organic through-holes, and the plurality of connection lines may extend across the bending area.

In an embodiment, a portion of each of the plurality of connection lines, which is on the organic material layer between the plurality of first organic through-holes, may be curved in the first direction to correspond to the shape of the upper surface of the organic material layer.

In an embodiment, an elongation percentage of the plurality of connection lines may be greater than an elongation percentage of the plurality of internal conductive lines and an elongation percentage of the plurality of external conductive lines.

In an embodiment, the plurality of internal conductive lines may include: a plurality of first internal conductive lines; and a plurality of second internal conductive lines in a different layer from the plurality of first internal conductive lines, where an insulating layer may be between the plurality of first internal conductive lines and the plurality of second internal conductive lines.

In an embodiment, the plurality of first internal conductive lines and the plurality of second internal conductive lines may be alternately arranged with each other.

In an embodiment, the plurality of external conductive lines may include: a plurality of first external conductive lines; and a plurality of second external conductive lines in a different layer from the plurality of first external conductive lines, and an insulating layer may be between the plurality of first external conductive lines and the plurality of second external conductive lines.

In an embodiment, the display apparatus may further include a thin film transistor in the first area or the second area, where the thin film transistor includes a semiconductor layer and a gate electrode which are insulated from each other by a first gate insulating layer. In such an embodiment, at least some of the plurality of internal conductive lines and the plurality of external conductive lines may include a same material as the gate electrode and be in a same layer as the gate electrode.

In an embodiment, the display apparatus may further include: a thin film transistor in the first area or the second area, wherein the thin film transistor includes a semiconductor layer and a gate electrode which are insulated from each other by a first gate insulating layer; a second gate insulating layer covering the thin film transistor; and a storage capacitor including a first storage capacitor plate in a same layer as the first gate insulating layer, and a second storage capacitor plate on the second gate insulating layer. In such an embodiment, at least some of the plurality of internal conductive lines and the plurality of external conductive lines may include a same material as the second storage capacitor plate and be in a same layer as the second storage capacitor plate.

In an embodiment, the display apparatus may further include: a thin film transistor in the first area or the second area, where the thin film transistor includes a semiconductor layer and a gate electrode which are insulated from each other by a first gate insulating layer; a second gate insulating layer covering the thin film transistor; and a storage capacitor including a first storage capacitor plate in a same layer as the gate electrode, and a second storage capacitor plate on the second gate insulating layer. In such an embodiment, some of the plurality of internal conductive lines may include a same material as the gate electrode and be in a same layer as the gate electrode, and the remaining internal conductive lines may include a same material as the second storage capacitor plate and be in a same layer as the second storage capacitor plate.

In an embodiment, the display apparatus may further include: a thin film transistor in the first area or the second area, where the thin film transistor includes a semiconductor layer and a gate electrode; an interlayer insulating layer covering the thin film transistor; and a data line on the interlayer insulating layer. In such an embodiment, at least one of the plurality of connection lines may include a same material as the data line and be in a same layer as the data line.

In an embodiment, the display apparatus may further include: a thin film transistor in the first area or the second area, where the thin film transistor includes a semiconductor layer and a gate electrode; an interlayer insulating layer covering the thin film transistor; a data line on the interlayer insulating layer; a first planarization layer on the interlayer insulating layer and covering the data line; and a conductive layer on the first planarization layer. In such an embodiment, at least one of the plurality of connection lines may include a same material as the conductive layer and be in a same layer as the conductive layer.

In an embodiment, the plurality of organic through-holes may further include a plurality of second organic through-holes spaced apart from the plurality of first organic through-holes, where connection lines connecting the plurality of second organic through-holes are located between the plurality of first organic through-holes.

In an embodiment, the display apparatus may further include an inorganic insulating layer, where an opening or a groove corresponding to the bending area is defined through the inorganic insulating layer. In such an embodiment, the organic material layer may fill the opening or the groove and extend to an upper surface of the inorganic insulating layer.

In an embodiment, the plurality of organic through-holes may expose the inorganic insulating layer, and the plurality of connection lines may be respectively connected to the plurality of internal conductive lines via contact holes defined in the inorganic insulating layer.

In an embodiment, an end of each of the plurality of internal conductive lines may overlap an inside of each of the plurality of organic through-holes, and an end of each of the plurality of internal conductive lines may not overlap a lower edge of each of the plurality of organic through-holes.

In an embodiment, at least some of the plurality of internal conductive lines and at least some of the plurality of external conductive lines may be in different layers from each other.

According to one or more embodiments, a display apparatus includes: a substrate comprising a display area and a peripheral area having a bending area, where the substrate is bent around a bending axis extending in a first direction; an inorganic insulating layer on the substrate, where an opening or a groove is defined in the inorganic insulating layer to correspond to the bending area; a plurality of internal conductive lines spaced apart from each other around the bending area; a plurality of external conductive lines spaced apart from each other around the bending area; an organic material layer filling the opening or the groove and covering at least portions of the plurality of internal conductive lines and the plurality of external conductive lines; and a plurality of connection lines on the organic material layer and connecting the plurality of internal conductive lines to the plurality of external conductive lines, respectively. In such embodiments, a plurality of organic through-holes is defined through the organic material layer, and the plurality of connection lines are respectively connected to the plurality of internal conductive lines through the plurality of organic through-holes. In such embodiments, the plurality of organic through-holes includes a plurality of first organic through-holes arranged in the first direction, and an upper surface of the organic material layer between the plurality of first organic through-holes has a convex curved shape.

In an embodiment, the plurality of internal conductive lines and the plurality of external conductive lines may be spaced apart from each other with the opening or the groove of the inorganic insulating layer therebetween.

In an embodiment, the display apparatus may further include: a thin film transistor in the display area, where the thin film transistor includes a semiconductor layer and a gate electrode which are insulated from each other by a first gate insulating layer; a second gate insulating layer covering the thin film transistor; and a storage capacitor including a first storage capacitor plate in a same layer as the first gate insulating layer and a second storage capacitor plate on the second gate insulating layer. In such an embodiment, the plurality of internal conductive lines include a plurality of first internal conductive lines including a same material as the gate electrode and in a same layer as the gate electrode, and a plurality of second internal conductive lines including a same material as the second storage capacitor plate and in a same layer as the second storage capacitor plate.

In an embodiment, the plurality of first internal conductive lines and the plurality of second internal conductive lines may be alternately arranged with each other.

In an embodiment, the display apparatus may further include: a thin film transistor in the display area, where the thin film transistor includes a semiconductor layer and a gate electrode; an interlayer insulating layer covering the thin film transistor; and a data line on the interlayer insulating layer. In such an embodiment, at least one of the plurality of internal conductive lines and the plurality of external conductive lines may include a same material as the gate electrode and be in the same layer as the gate electrode, and at least one of the plurality of connection lines may include a same material as the data line and be in a same layer as the data line.

In an embodiment, an end of each of the plurality of internal conductive lines may overlap an inside of each of the plurality of organic through-holes, and an end of each of the plurality of internal conductive lines may not overlap a lower edge of each of the plurality of organic through-holes.

In an embodiment, the display apparatus may further include: a bending protective layer on the plurality of connection lines.

According to one or more embodiments, a display apparatus includes: a substrate on which a first area, a second area, and a bending area between the first area and the second area are defined, where the substrate is bent around a bending axis extending in a first direction; a display area arranged in the first area; an encapsulation layer covering the display area and including an organic encapsulation layer; a plurality of internal conductive lines arranged in the first area and a plurality of external conductive lines arranged in the second area; an organic material layer covering the bending area and covering at least a portion of the plurality of internal conductive lines and the plurality of external conductive lines; and a plurality of connection lines on the organic material layer and connecting the plurality of internal conductive lines to the plurality of external conductive lines, respectively. In such embodiment, a plurality of organic through-holes is defined through the organic material layer, and the plurality of connection lines are respectively connected to the plurality of internal conductive lines between the first area and the bending area through the plurality of organic through-hole. In such embodiments, the organic encapsulation layer and the organic material layer are spaced apart from each other.

In an embodiment, the plurality of organic through-holes may include a plurality of first organic through-holes arranged in the first direction, and an upper surface of the organic material layer between the plurality of first organic through-holes may have a convex curved shape.

In an embodiment, a portion of each of the plurality of connection lines may be on the upper surface of the organic material layer having the convex curved shape, and the plurality of connection lines may extend across the bending area.

In an embodiment, the encapsulation layer may further include a first inorganic encapsulation layer and a second inorganic encapsulation layer, the organic encapsulation layer may be disposed between the first inorganic encapsulation layer and the second inorganic encapsulation layer, and the encapsulation layer and the organic material layer may be spaced apart from each other.

In an embodiment, an end of each of the plurality of internal conductive lines may overlaps an inside of each of the plurality of organic through-holes, and an end of each of the plurality of internal conductive lines may not overlap a lower edge of each of the plurality of organic through-holes.

According to one or more embodiments as described herein, an interval between conductive lines in the display apparatus may be reduced and an occurrence of defects of the conductive lines may be reduced.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
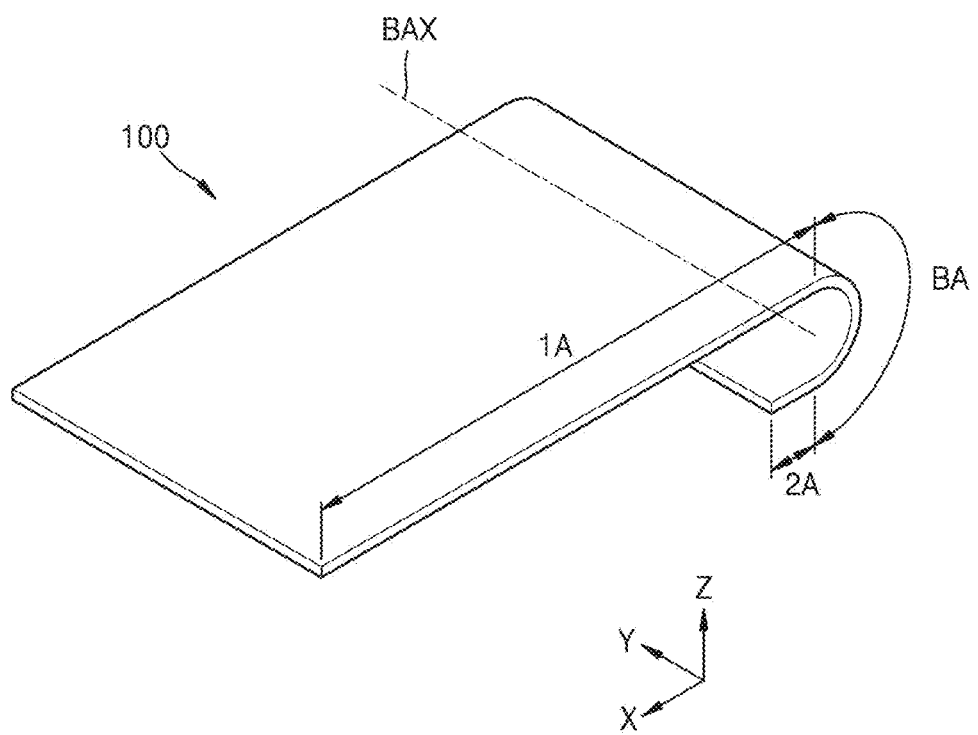
FIG. 1 is a perspective view of a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

An embodiment of a display apparatus, which is an apparatus displaying images, may be a liquid crystal display ("LCD") apparatus, an electrophoretic display apparatus, an organic light-emitting display apparatus, an inorganic light-emitting display apparatus, a field emission display ("FED") apparatus, a surface-conduction electron-emitter ("SED") display apparatus, a plasma display apparatus, a cathode ray display apparatus, or the like.

Hereinafter, for convenience of description, embodiments of a display apparatus, where the display apparatus is an organic light-emitting display apparatus, will be described in detail with reference to the accompanying drawings, but embodiments of the display apparatus are not limited thereto, and various types of display apparatuses may be used.

Figure 2:
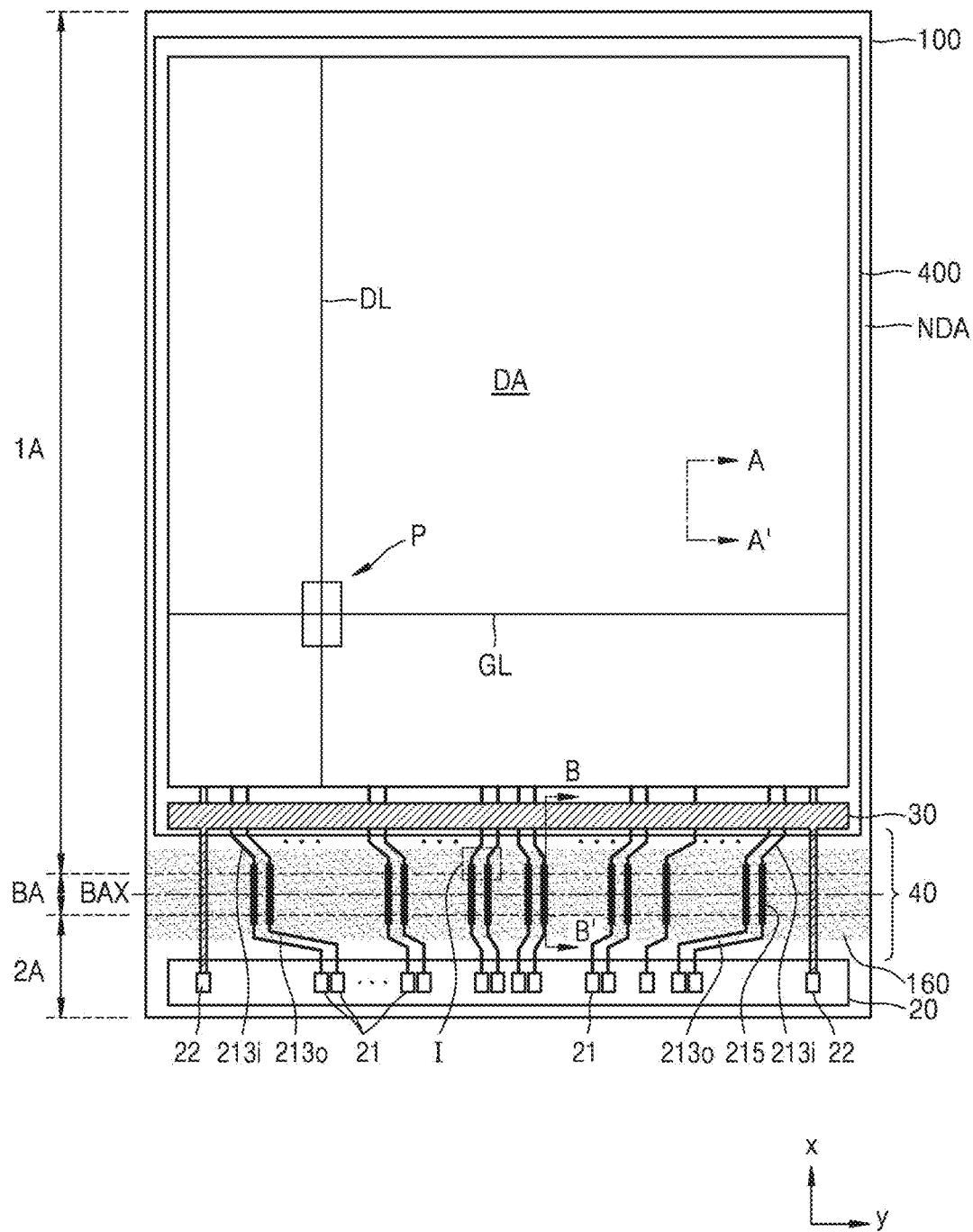
FIG. 2 is a plan view of a portion of the display apparatus of FIG. 1.
Figure 3:
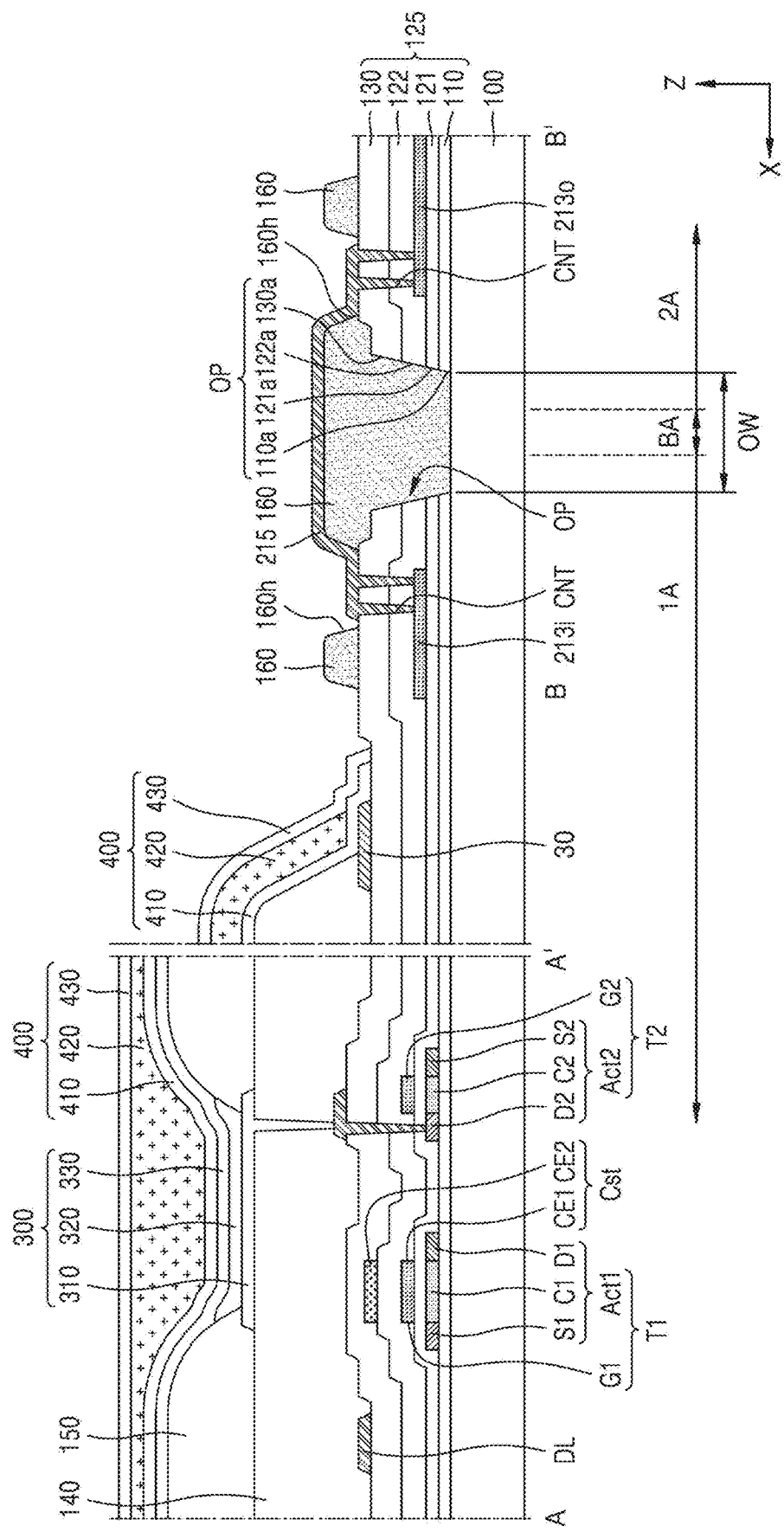
FIG. 3 shows cross-sectional views of portions of the display apparatus, taken along lines A-A' and B-B' of FIG. 2.

FIG. 1 is a perspective view of a portion of a display apparatus according to an embodiment, FIG. 2 is a plan view of a portion of the display apparatus of FIG. 1, and FIG. 3 shows cross-sectional views of portions of the display apparatus, taken along lines A-A' and B-B' of FIG. 2.

According to an embodiment, a portion of a substrate 100, which is a portion of the display apparatus, is bent as shown in FIG. 1, such that a portion of the display apparatus may have a bent form in the manner of the substrate 100. In FIGS. 2 and 3, the display apparatus is illustrated in an unbent state for convenience of illustration. For reference, in cross-sectional views and plan views of embodiments to be described below, the display apparatus will be illustrated in an unbent state for convenience of illustration.

In an embodiment, as shown in FIGS. 1 to 3, the substrate 100 included in the display apparatus may have a bending area BA which extends in a first direction (+y direction). The bending area BA may be between a first area 1A and a second area 2A which extend in a second direction (+x direction) crossing the first direction. In one embodiment, for example, the substrate 100 may be bent around a bending axis BAX which extends in the first direction (+y direction), as shown in FIG. 1. In an embodiment, as shown in FIG. 1, the substrate 100 may be bent around the bending axis BAX with a uniform radius of curvature, but the embodiment is not limited thereto. Alternatively, the substrate 100 may be bent around the bending axis BAX with a non-uniform radius of curvature.

In an embodiment, the substrate 100 may include various materials having flexible or bendable characteristics. In an embodiment, the substrate 100 may include, for example, a polymer resin such as polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"). The substrate 100 may have a single-layered or multi-layered structure including at least one of the materials above. In an embodiment where the substrate 100 has a multi-layered structure, the substrate 100 may further include an inorganic material layer.

The first area 1A may include a display area DA. In an embodiment, the first area 1A may further include a portion of a non-display area NDA outside the display area DA, as shown in FIG. 2. The second area 2A may include a portion of the non-display area NDA.

A plurality of pixels P may be arranged in the display area DA of the substrate 100 to display an image. Elements such as a thin film transistor ("TFT"), an organic light-emitting device ("OLED"), and a capacitor may be arranged in the display area DA.

The display area DA may further include signal lines such as a gate line GL for transmitting a gate signal, a data line DL for transmitting a data signal, a driving power line for transmitting driving power, and a common power line, and each of the pixels P may be collectively defined by an electrical combination of the TFT, the capacitor, the OLED, etc., which are connected to the gate line GL, the data line DL, the driving power line and the common power line, to display an image. The pixel P may emit light at a brightness corresponding to a driving current passing through the OLED, in response to a data signal based on a driving power supplied to the pixel P and a common power. The signal lines may be connected to a terminal unit 20 of the non-display area NDA. The plurality of pixels P may be arranged in various forms, such as a stripe array or a PenTile array. The display apparatus may further include an encapsulation member for encapsulating the display area DA to be sealed from the outside air.

In an embodiment, the terminal unit 20, a first power supply voltage line 30 and a wiring unit 40 may be arranged in the non-display area NDA. In such an embodiment, although not shown in FIGS. 1 to 3, a common power line, a gate driver, a data driver, etc. may be further arranged in the non-display area NDA.

The terminal unit 20 may be arranged at an end of the non-display area NDA and include a plurality of terminals 21 and 22. The terminal unit 20 may not be covered by an insulating layer but may be exposed, and may be electrically connected to a controller (not shown) such as a flexible printed circuit board ("PCB") and a driver integrated circuit ("IC"). The controller may provide the data signal, the gate signal, a first power supply voltage, a second power supply voltage, etc., to the pixels P through the terminal unit 20.

Here, the first power supply voltage may be a driving voltage (ELVDD), and the second power supply voltage may be a common voltage (ELVSS).

The first power supply voltage line 30 may be connected to the controller via the terminal 22 and provide the first power supply voltage supplied to the pixels P via the controller. The first power supply voltage line 30 may be arranged in the non-display area NDA to cover a side portion of a surface of the display area DA.

The wiring unit 40 may include a plurality of internal conductive lines 213*i* connected to the signal lines of the display area DA, a plurality of external conductive lines 213*o* connected to the terminal unit 20 of the non-display area NDA, and connection lines 215 connecting the plurality of internal conductive lines 213*i* to the plurality of external conductive lines 213*o*, respectively.

In an embodiment, the connection lines 215 may overlap the bending area BA. In such an embodiment, the connection lines 215 may extend from the first area 1A to the second area 2A through the bending area BA. The connection lines 215 may extend to cross the bending axis BAX. In one embodiment, for example, the connection lines 215 may extend in a direction perpendicular to the bending axis BAX, but are not limited thereto. Alternatively, the connection lines 215 may have various other modifications such as extending in a direction which is non-perpendicular with respect to the bending axis BAX, and at a certain angle. In an embodiment, the connection lines 215 may have various forms, such as a curved form and a zigzag form, other than a linear form.

An organic material layer 160 may be arranged around the bending area BA and cover an area, in which the connection lines 215 and the internal conductive lines 213*i* are connected to each other, and an area in which the connection lines 215 and the external conductive lines 213*o* are connected to each other. In the bending area BA, the organic material layer 160 may be arranged under the connection lines 215. The organic material layer 160 will be described later in greater detail.

FIG. 3 shows that an OLED 300 is arranged, as a display element, in the display area DA. In an embodiment, the OLED 300 may be electrically connected to a first TFT T1 or a second TFT T2 through a pixel electrode 310 thereof. A TFT (not shown) may be arranged in a peripheral area outside the display area DA of the substrate 100, as desired. The TFT arranged in the peripheral area may be, for example, a portion of a circuit unit for controlling an electrical signal applied to the display area DA.

The first TFT T1 may include a first semiconductor layer Act1 and a first gate electrode G1, and the second TFT T2 may include a second semiconductor layer Act2 and a second gate electrode G2.

Each of the first semiconductor layer Act1 and the second semiconductor layer Act2 may include amorphous silicon, polycrystalline silicon, an oxide semiconductor material, or an organic semiconductor material. The first semiconductor layer Act1 may include a channel region C1, and further include a source region S1 and a drain region D1 arranged (or disposed) on both sides of the channel region C1, respectively. The second semiconductor layer Act2 may include a channel region C2, and further include a source region S2 and a drain region D2 arranged on both sides of the channel region C2, respectively.

The first gate electrode G1 overlaps the channel region C1 of the first semiconductor layer Act1 with a first gate insulating layer 121 therebetween, and the second gate electrode G2 overlaps the channel region C2 of the second semiconductor layer Act2 with the first gate insulating layer 121 therebetween. The first gate electrode G1 and the second gate electrode G2 may be connected to a gate line (not shown) which provides an on/off signal to the first TFT T1 and/or the second TFT T2, and may include a low-resistance metal material. In one embodiment, for example, each of the first and second gate electrodes G1 and G2 may have a single-layer or multi-layer structure, and may include a conductive material including molybdenum (Mo), aluminum (Al), copper (Cu) and/or titanium (Ti), etc. In an embedment, as shown in FIG. 3, the first gate electrode G1 and the second gate electrode G2 are arranged in a same layer as each other, the embodiment is not limited thereto. Alternatively, the first gate electrode G1 and the second gate electrode G2 may be arranged in different layers from each other.

Figure 12:
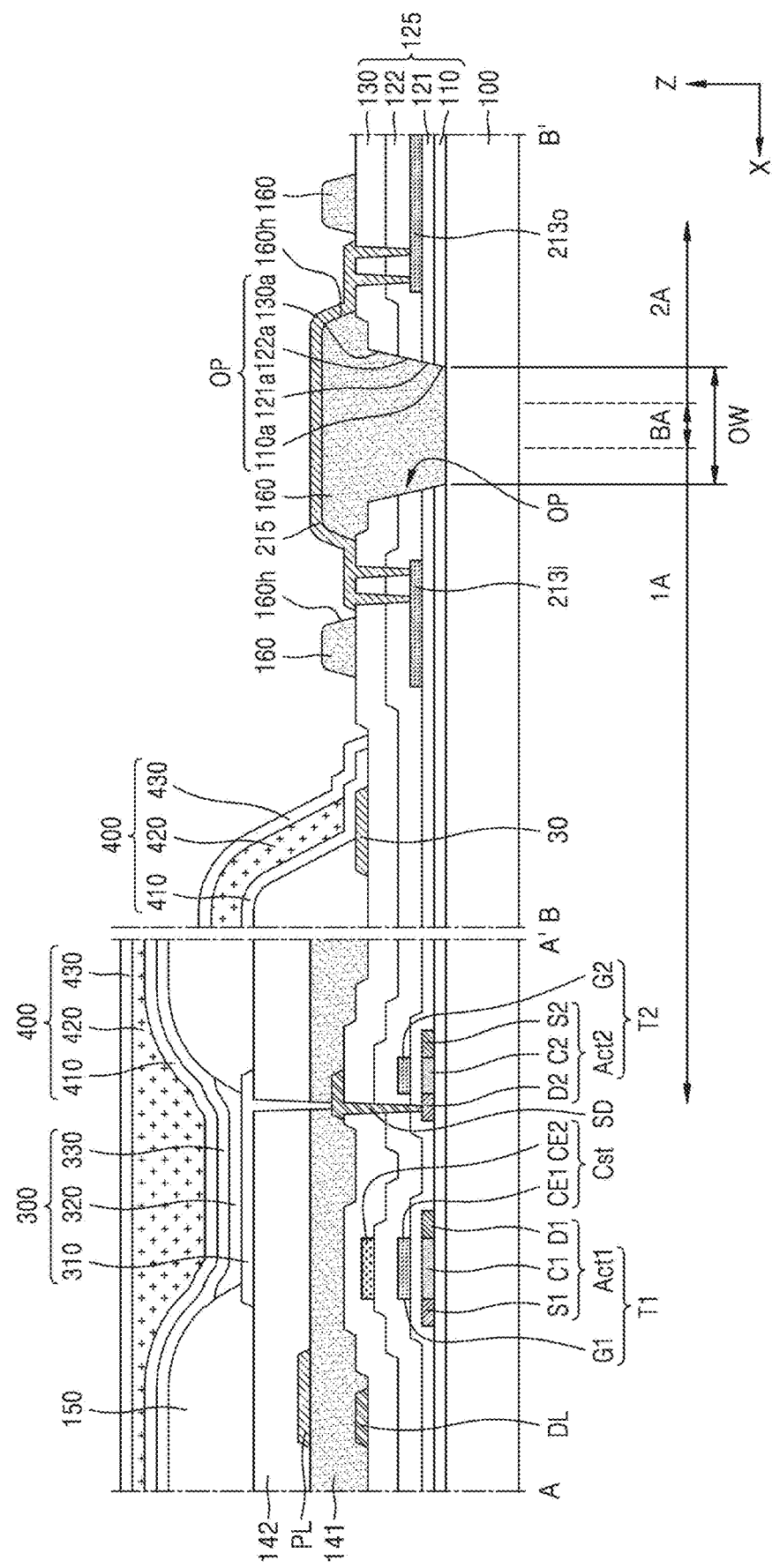
FIG. 12 shows cross-sectional views of portions of a display apparatus according to another embodiment.

The second TFT T2 may include a source electrode (not shown) and/or a drain electrode SD (shown in FIG. 12). The source electrode and the drain electrode SD may have a single-layer or multi-layer structure, and may include a conductive material having high conductivity. The source electrode and the drain electrode SD may be connected to the source region S2 and the drain region D2 of the second semiconductor layer Act2, respectively. In one embodiment, for example, the source electrode and the drain electrode SD may have a single-layer or multi-layer structure, and may include a conductive material, for example, Al, Cu, and/or Ti, etc. The first TFT T1 may include a source electrode and a drain electrode, which are connected to the source region S1 and the drain region D1 of the first semiconductor layer Act1, respectively, but is not limited thereto. Alternatively, the source region S1 and the drain region D1 themselves may function as a source electrode and a drain electrode, and a source electrode and a drain electrode may be omitted.

The source electrode and/or the drain electrode SD may be connected to the second semiconductor layer Act2 via a contact hole. The contact hole may be formed by simultaneously etching an interlayer insulating layer 130, a second gate insulating layer 122 and the first gate insulating layer 121.

In an embodiment, the first and second TFTs T1 and T2 may be a top gate type in which the first and second gate electrodes G1 and G2 are arranged above the first and second semiconductor layers Act1 and Act2, respectively, but the embodiment is not limited thereto. In an alternative embodiment, the first or second TFT T1 or T2 may be a bottom gate type in which the first or second gate electrode G1 or G2 is arranged under the first or second semiconductor layer Act1 or Act2.

A storage capacitor Cst may overlap the first TFT T1. In such an embodiment, the areas of the storage capacitor Cst and the first TFT T1 may be increased, and thus, quality images may be improved. In one embodiment, for example, the first gate electrode G1 may be a first storage capacitor plate CE1 of the storage capacitor Cst. A second storage capacitor plate CE2 may overlap the first storage capacitor plate CE1 with the second gate insulating layer 122 interposed between the second storage capacitor plate CE2 and the first storage capacitor plate CE1. The second gate insulating layer 122 may include an inorganic insulating material such as silicon oxide (SiOx), silicon nitride (SiNx), and/or silicon oxynitride (SiON), for example. In an alternative embodiment, the storage capacitor Cst may not overlap the first TFT T1.

In an embodiment, the first gate insulating layer 121 including an inorganic insulating material such as a silicon oxide, a silicon nitride, and/or a silicon oxynitride may be arranged between the first semiconductor layer Act1 and the first gate electrode G1, and between the second semiconductor layer Act2 and the second gate electrode G2, such that insulation between the first semiconductor layer Act1 and the first gate electrode G1 and insulation between the second semiconductor layer Act2 and the second gate electrode G2 may be secured.

The second gate insulating layer 122 including an inorganic insulating material such as a silicon oxide, a silicon nitride, and/or a silicon oxynitride may be arranged on the first and second gate electrodes G1 and G2. The interlayer insulating layer 130 including an inorganic insulating material such as a silicon oxide, a silicon nitride, and/or a silicon oxynitride may be arranged on the second storage capacitor plate CE2.

The source electrode and the drain electrode SD may be arranged on the interlayer insulating layer 130. The data line DL may be arranged on the interlayer insulating layer 130, in a same layer as the source electrode and the drain electrode SD, and be electrically connected to the source electrode and the drain electrode SD.

In an embodiment, insulating layers including an inorganic material may be formed via chemical vapor deposition ("CVD") or atomic layer deposition ("ALD"). Such a forming method is applicable to the embodiments described above and various modifications thereof to be described below.

A buffer layer 110 including an inorganic material such as a silicon oxide, a silicon nitride, and/or a silicon oxynitride may be arranged between the first and second TFTs T1 and T2 and the substrate 100 in the above-described structure. The buffer layer 110 may provide a flatness surface on the substrate 100, or effectively prevent or substantially reduce infiltration of impurities from the substrate 100, etc. to the first and second semiconductor layers Act1 and Act2. The buffer layer 110 may include an inorganic material, such as an oxide or a nitride, an organic material, or a combination thereof, and have a single-layer or multi-layer structure. In some embodiments, the buffer layer 110 may have a triple-layered structure including a silicon oxide layer, a silicon nitride layer, and a silicon oxynitride layer.

A planarization layer 140 may be arranged over the first and second TFTs T1 and T2 and the storage capacitor Cst. The planarization layer 140 may cover the first and second TFTs T1 and T2 and the storage capacitor Cst. An upper surface of the planarization layer 140 may be substantially planarized. The planarization layer 140 may include an organic material such as acryl, benzocyclobutene ("BCB"), and hexamethyldisiloxane ("HMDSO"), for example. In an embodiment, as shown in FIG. 3, the planarization layer 140 may have a single-layer structure, but not being limited thereto. In an alternative embodiment, the planarization layer 140 may be variously modified. In one alternative embodiment, for example, the planarization layer 140 may have a multi-layered structure.

In an embodiment, the OLED 300 including the pixel electrode 310, an opposite electrode 330, and an intermediate layer 320 interposed therebetween and including a light-emitting layer, may be arranged on the planarization layer 140 in the display area DA of the substrate 100. The pixel electrode 310 may contact any one of the source electrode and the drain electrode SD via an opening defined through the planarization layer 140, etc., and be electrically connected to the second TFT T2, as shown in FIG. 3.

A pixel-defining layer 150 may be arranged on the planarization layer 140. An opening may be defined in the pixel-defining layer 150 to correspond to respective sub-pixels, that is, the opening exposes at least a central portion of the pixel electrode 310 to be exposed, thereby defining a pixel. In an embodiment, as shown in FIG. 3, the pixel-defining layer 150 may effectively prevent occurrence of an arc, etc. on an edge of the pixel electrode 310 by increasing a distance between the edge of the pixel electrode 310 and the opposite electrode 330 above the pixel electrode 310. The pixel-defining layer 150 may include, for example, an organic material such as PI and HMDSO.

The intermediate layer 320 of the OLED 300 may include a low molecular weight material or a high molecular weight (polymer) material. In an embodiment, where the intermediate layer 320 includes a low molecular weight material, the intermediate layer 320 may have a structure in which a hole injection layer ("HIL"), a hole transport layer ("HTL"), an emission layer ("EML"), an electron transport layer ("ETL"), an electron injection layer ("EIL"), etc. are stacked in a single or composite structure, and may include at least one of various organic materials such as copper phthalocyanine ("CuPc"), N,N'-Di(naphthalene-1-yl)-N,N'-diphenyl-benzidine ("NPB"), and tris-8-hydroxyquinoline aluminum ("Alq3"). The above-described layers may be formed via a vacuum deposition method.

In an alternative embodiment, where the intermediate layer 320 includes a high molecular weight material, the intermediate layer 320 may have a structure which generally includes an HTL and an EML. In such an embodiment, the HTL may include poly(3,4-ethylenedioxythiophene) ("PEDOT"), and the EML may include a high molecular weight material such as poly-phenylenevinylene ("PPV") or polyfluorene. In such an embodiment the intermediate layer 320 may be formed via screen printing, inkjet printing, laser induced thermal imaging ("LITI"), etc.

The intermediate layer 320 is not limited thereto and may have one of various other structures. In an embodiment, the intermediate layer 320 may include an integrated layer covering a plurality of pixel electrodes 310, or may include a patterned layer corresponding to each of the plurality of pixel electrodes 310.

The opposite electrode 330 may be arranged on a top portion of the display area DA and cover the display area DA, as illustrated in FIG. 3. In such an embodiment, the opposite electrode 330 may be integrally formed at a single unitary unit for a plurality of OLEDs 300, and thus may correspond to the plurality of pixel electrodes 310.

In an embodiment, an encapsulation layer 400 may protect the OLEDs 300, which may be easily damaged by humidity, oxygen, etc. from the outside, by encapsulating the OLEDs 300. The encapsulation layer 400 may cover the display area DA and extend to the outside of the display area DA. The encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include at least one of a ceramic material, a metal oxide, a metal nitride, a metal carbide, a metal oxynitride, indium oxide (InO), tin oxide (SnO), indium tin oxide ("ITO"), silicon oxide, silicon nitride, and silicon oxynitride, etc. Other layers such as a capping layer may be arranged between the first inorganic encapsulation layer 410 and the opposite electrode 330, if desired. Since the first inorganic encapsulation layer 410 is formed along a structure thereunder, an upper surface of the first inorganic encapsulation layer 410 may not be flat, as shown in FIG. 3. The organic encapsulation layer 420 may cover the first inorganic encapsulation layer 410, and an upper surface thereof may be substantially flat, unlike the first inorganic encapsulation layer 410. In detail, the upper surface of the organic encapsulation layer 420 may be substantially flat in an area corresponding to the display area DA. The organic encapsulation layer 420 may include at least one selected from acrylic, methacrylic, polyester, polyethylene, polypropylene, PET, PEN, PC, PI, polyethylene sulfonate ("PES"), polyoxymethylene ("POM"), polyarylate, and hexamethyldisiloxane. The second inorganic encapsulation layer 430 may cover the organic encapsulation layer 420 and may include at least one of a ceramic material, a metal oxide, a metal nitride, a metal carbide, a metal oxynitride, InO, SnO, ITO, silicon oxide, silicon nitride, and silicon oxynitride, etc. The second inorganic encapsulation layer 430 may effectively prevent the organic encapsulation layer 420 from being exposed to the outside by contacting the first inorganic encapsulation layer 410 at an edge arranged outside the display area DA, as shown in FIG. 3.

In an embodiment, as shown in FIGS. 2 and 3, the encapsulation layer 400 covers at least a portion of the first power supply voltage line 30, but the embodiment is not limited thereto. In one embodiment, for example, the encapsulation layer 400 may not cover the first power supply voltage line 30, but may cover only an area corresponding to the display area DA.

In an embodiment, where the encapsulation layer 400 includes the first inorganic encapsulation layer 410, the organic encapsulation layer 420 and the second inorganic encapsulation layer 430, even when a crack forms in the encapsulation layer 400 through the multi-layered structure, the crack may not be connected between the first inorganic encapsulation layer 410 and the organic encapsulation layer 420 or between the organic encapsulation layer 420 and the second inorganic encapsulation layer 430. In such an embodiment, the formation of a route, through which humidity or oxygen from the outside may penetrate into the display area DA, may effectively prevented or substantially minimized. Although not shown in the drawings, various functional layers, such as a polarizing layer for reducing external light reflection, a black matrix, a color filter, and/or a touch screen layer including a touch electrode, may be provided on the encapsulation layer 400.

The buffer layer 110, the first gate insulating layer 121, the second gate insulating layer 122 and the interlayer insulating layer 130, each of which includes an inorganic material, may be collectively referred to as an inorganic insulating layer 125. In an embodiment, an opening OP is defined through the inorganic insulating layer 125 in a region corresponding to the bending area BA, as shown in FIG. 3. In such an embodiment, an opening 110a, an opening 121a, an opening 122a and an opening 130a, which correspond to the bending area BA, are defined through the buffer layer 110, the first gate insulating layer 121, the second gate insulating layer 122 and the interlayer insulating layer 130, respectively. In such an embodiment, where the opening OP corresponds to the bending area BA, the opening OP overlaps the bending area BA. In an embodiment, an area of the opening OP may be larger than that of the bending area BA. In such an embodiment, as shown in FIG. 3, a width OW of the opening OP may be greater than a width of the bending area BA. Here, the area of the opening OP may be defined as the area of an opening with the smallest area among the opening 110a of the buffer layer 110, the opening 121a of the first gate insulating layer 121, the opening 122a of the second gate insulating layer 122 and the opening 130a of the interlayer insulating layer 130. In an embodiment, as shown in FIG. 3, the area of the opening OP of the inorganic insulating layer 125 may be defined by the area of the opening 110a of the buffer layer 110.

In an embodiment, as shown in FIG. 3, an inner surface of the opening 110a of the buffer layer 110 and an inner surface of the opening 121a of the first gate insulating layer 121 coincide with each other, but the embodiment is not limited thereto. In one alternative embodiment, for example, the area of the opening 121a of the first gate insulating layer 121 may be larger than that of the opening 110a of the buffer layer 110.

In an embodiment, the display apparatus may include the organic material layer 160 filling the opening OP of the inorganic insulating layer 125. In such an embodiment, the organic material layer 160 may overlap the bending area BA. The organic material layer 160 may extend to a portion of a non-bending area around the bending area BA.

In an embodiment, the display apparatus may include a connection line 215. The connection line 215 may extend from the first area 1A to the second area 2A through the bending area BA and may be arranged on the organic material layer 160. The connection line 215 may be arranged on the inorganic insulating layer 125, for example, on the interlayer insulating layer 130, where the organic material layer 160 is not present. The connection line 215 may transmit an electrical signal to the display area DA, and may be formed simultaneously with the source electrode, the drain electrode SD or the data line DL, with a same material.

As described above, in FIG. 3, the display apparatus is illustrated as being unbent for the sake of convenience. However, the substrate 100, etc. of the display apparatus may be in a bent state in the bending area BA, as shown in FIG. 1. In an embodiment, the display apparatus is manufactured in a state where the substrate 100 is approximately flat as shown in FIG. 3 in a manufacturing process, and thereafter, the substrate 100, etc. are bent in the bending area BA so that the display apparatus has a shape as shown in FIG. 1. In such an embodiment, tensile stress may be applied to the connection line 215 in a process in which the substrate 100, etc. are bent in the bending area BA. In an embodiment of the display apparatus, an occurrence of defects in the connection line 215 during the bending process may be effectively prevented or substantially reduced.

In such an embodiment, if the opening OP is not defined or formed through the inorganic insulating layer 125 in the bending area BA and thus, the inorganic insulating layer 125 has a continuous shape from the first area 1A to the second area 2A and the connection line 215 is arranged on the inorganic insulating layer 125, high tensile stress may be applied to the connection line 215 in a process in which the substrate 100, etc. are bent. Since hardness of the inorganic insulating layer 125 is greater than that of the organic material layer 160, there may be a very high probability that a crack, etc. occur in the inorganic insulating layer 125 in the bending area BA. Accordingly, when a crack forms in the inorganic insulating layer 125, there may be a very high probability that a crack, etc. occur in the connection line 215 on the inorganic insulating layer 125, and thus defects such as broken wiring in the connection line 215 may occur.

In an embodiment of the display apparatus, the opening OP is defined through the inorganic insulating layer 125 in the bending area BA, as described above, and the connection line 215 may be arranged on the organic material layer 160 which fills the opening OP. In such an embodiment, since the opening OP is defined through the inorganic insulating layer 125 in the bending area BA, the probability that cracks, etc. occur in the inorganic insulating layer 125 may be substantially low. Here, the probability of a crack forming in the organic material layer 160 is low due to characteristics of organic materials. Thus, the formation of cracks, etc. in the connection line 215 arranged on the organic material layer 160 may be effectively prevented or the probability of crack formation may be reduced. In such an embodiment, since the hardness of the organic material layer 160 is less than that of the inorganic material layer, the organic material layer 160 may absorb the tensile stress caused by the bending of the substrate 100, etc., and thus, the concentration of the tensile stress in the connection line 215 may be effectively reduced.

The organic material layer 160 may include at least one selected from acrylic, methacrylic, polyester, polyethylene, polypropylene, PET, PEN, PC, PI, PES, POM, polyallylate, and hexamethyldisiloxane.

The organic material layer 160 may be formed when a layer including an organic material, included in the display area DA, is formed, with the same material as the layer. In an embodiment, when the planarization layer 140 or the pixel-defining layer 150 is formed, the organic material layer 160 may be simultaneously formed with a same material as the planarization layer 140 or the pixel-defining layer 150. In one embodiment, for example, the organic material layer 160 may be simultaneously formed with the pixel-defining layer 150, using a same material. In one alternative embodiment, for example, the organic material layer 160 may be simultaneously formed with the organic encapsulation layer 420 of the encapsulation layer 400, using a same material.

In an embodiment, the organic material layer 160 may be spaced apart from a layer in the display area DA including an organic material. In one embodiment, for example, as shown in FIG. 3, the organic material layer 160 may be spaced apart from the planarization layer 140 and the pixel-defining layer 150 in the display area DA.

In an embodiment, the organic material layer 160 may be spaced apart from at least one of the organic encapsulation layers (e.g., the first organic encapsulation layer 420) in the encapsulation layer 400. In an embodiment, as shown in FIG. 3, the first inorganic encapsulation layer 410 and the second inorganic encapsulation layer 430 are spaced apart from the organic material layer 160, but the embodiment is not limited thereto. In one alternative embodiment, for example, a portion of the first or second inorganic encapsulation layer 410 or 430 of the encapsulation layer 400 may be in contact with the organic material layer 160.

In an embodiment, the display apparatus may include the internal conductive line 213i and the external conductive line 213o, both connected to the connection line 215, in addition to the connection line 215. The internal conductive line 213i and the external conductive line 213o may be arranged in the first area 1A or the second area 2A so that the internal conductive line 213i and the external conductive line 213o are positioned in a layer different from a layer in which the connection line 215 is positioned, and may be electrically connected to the connection line 215.

In an exemplary embodiment, as shown in FIG. 3, the internal conductive line 213i is positioned in the first area 1A and the external conductive line 213o is positioned in the second area 2A. In an embodiment, as shown in FIG. 3, the internal conductive line 213i and the external conductive line 213o include a same material as the first gate electrode G1 and are positioned in a same layer as the first gate electrode G1, that is, on the first gate insulating layer 121.

The connection line 215 may contact the internal conductive line 213i and the external conductive line 213o via organic through-holes 160h defined in the organic material layer 160 and contact holes CNT defined through the interlayer insulating layer 130 and the second gate insulating layer 122. Each organic through-hole 160h exposes an upper surface of a portion of the inorganic insulating layer 125, and the contact hole CNT is defined to overlap a respective organic through-hole 160h. In an embodiment, as shown in FIG. 3, two contact holes CNT may be arranged in one organic through-hole 160h, but the embodiment is not limited thereto. In such an embodiment, the number of contact holes CNT arranged in one organic through-hole 160h may be variously modified.

The internal conductive line 213i in the first area 1A may be electrically connected to the first and second TFTs T1 and T2 in the display area DA, and accordingly, the connection line 215 may be electrically connected to the first and second TFTs T1 and T2 in the display area DA and/or the data line DL via the internal conductive line 213i. In an embodiment, the internal conductive line 213i may be connected, via a contact hole, to a conductive layer arranged in another layer in the display area DA, for example, a conductive layer on the interlayer insulating layer 130 or a conductive layer on the second gate insulating layer 122.

The external conductive line 213o in the second area 2A may be electrically connected to the first and second TFTs T1 and T2 in the display area DA and/or the data line DL via the connection line 215. In an embodiment, the external conductive line 213o may be connected, via a contact hole, to a conductive layer arranged in another layer in the second area 2A, for example, a conductive layer on the interlayer insulating layer 130 or a conductive layer on the second gate insulating layer 122.

In such an embodiment, the internal conductive line 213i and the external conductive line 213o may be electrically connected to components positioned in the display area DA, while being positioned outside the display area DA. In such an embodiment, the internal conductive line 213i and the external conductive line 213o may extend in a direction of the display area DA while being positioned outside the display area DA, and thus, at least portions of the internal and external conductive lines 213i and 213o may be in the display area DA.

Hereinabove, the display apparatus in an unbent state is illustrated in FIG. 3 for convenience of illustration and description; however, an embodiment of the display apparatus is in a state in which the substrate 100, etc. are bent in the bending area BA, as shown in FIG. 1. In such an embodiment, the display apparatus is manufactured in a state where the substrate 100 is approximately flat as shown in FIG. 3 in a manufacturing process, and thereafter, the substrate 100, etc. are bent in the bending area BA so that the display apparatus has a shape as shown in FIG. 1. In such an embodiment, tensile stress may be applied to components in the bending area BA in a process in which the substrate 100, etc. are bent in the bending area BA.

Accordingly, in such an embodiment, where the connection line 215 crosses the bending area BA, the formation of a crack in the connection line 215 or defects such as broken wiring in the connection line 215 may be prevented by including a material with a high elongation percentage. In such an embodiment, by forming the internal and external conductive lines 213i and 213o in the first area 1A or the second area 2A with a material which has an elongation percentage lower than that of the connection line 215 and has electrical/physical characteristics different from those of the connection line 215, an efficiency of electrical signal transfer in the display apparatus may be enhanced or a rate of occurrence of defects in the manufacturing process may be reduced. In one embodiment, for example, the internal and external conductive lines 213*i* and 213*o* may include Mo, and the connection line 215 may include Al. In an embodiment, either the connection line 215 or the internal and external conductive lines 213*i* and 213*o* may selectively have a multi-layered structure. An end of the external conductive line 213*o* in the second area 2A may be exposed to the outside, and thus may be electrically connected to various electronic devices or a printed circuit board.

In an embodiment, the organic material layer 160 extends to a contact area where the connection line 215 is connected to the internal conductive line 213*i* and the external conductive line 213*o*. The organic through-holes 160*h* are defined or formed in the organic material layer 160 so that the connection line 215 is connected to the internal conductive line 213*i* and the external conductive line 213*o* via the organic through-holes 160*h*. In such an embodiment, the connection line 215 is allowed to be in contact with the inorganic insulating layer 125 only via the organic through-holes 160*h*, and thus, short-circuiting with an adjacent connection line 215, which may be caused by a conductive material remaining in a process of patterning the connection line 215, may be effectively prevented.

In an alternative embodiment, the interlayer insulating layer 130 or the second gate insulating layer 122 of the inorganic insulating layer 125 around the bending area BA may be omitted. In such an embodiment, only one of the interlayer insulating layer 130 and the second gate insulating layer 122 may be arranged between the connection line 215 and the internal conductive line 213*i*, in an organic through-hole 160*h*, and thus, a contact hole CNT for connecting the connection line 215 to the internal conductive line 213*i* may only penetrate the interlayer insulating layer 130 or the second gate insulating layer 122.

In another alternative embodiment, only one of the interlayer insulating layer 130 and the second gate insulating layer 122 may be arranged between the connection line 215 and the external conductive line 213*o*, in an organic through-hole 160*h*, and thus, a contact hole CNT for connecting the connection line 215 to the external conductive line 213*o* may only penetrate the interlayer insulating layer 130 or the second gate insulating layer 122.

The inorganic insulating layer 125 arranged between the connection line 215 and the internal conductive line 213*i* and between the connection line 215 and the external conductive line 213*o* may be variously modified. In one embodiment, for example, only the interlayer insulating layer 130 may be between the connection line 215 and the internal conductive line 213*i* and between the connection line 215 and the external conductive line 213*o*. Alternatively, only the interlayer insulating layer 130 may be present between the connection line 215 and the internal conductive line 213*i*, and only the second gate insulating layer 122 may be between the connection line 215 and the external conductive line 213*o*.

Figure 4:
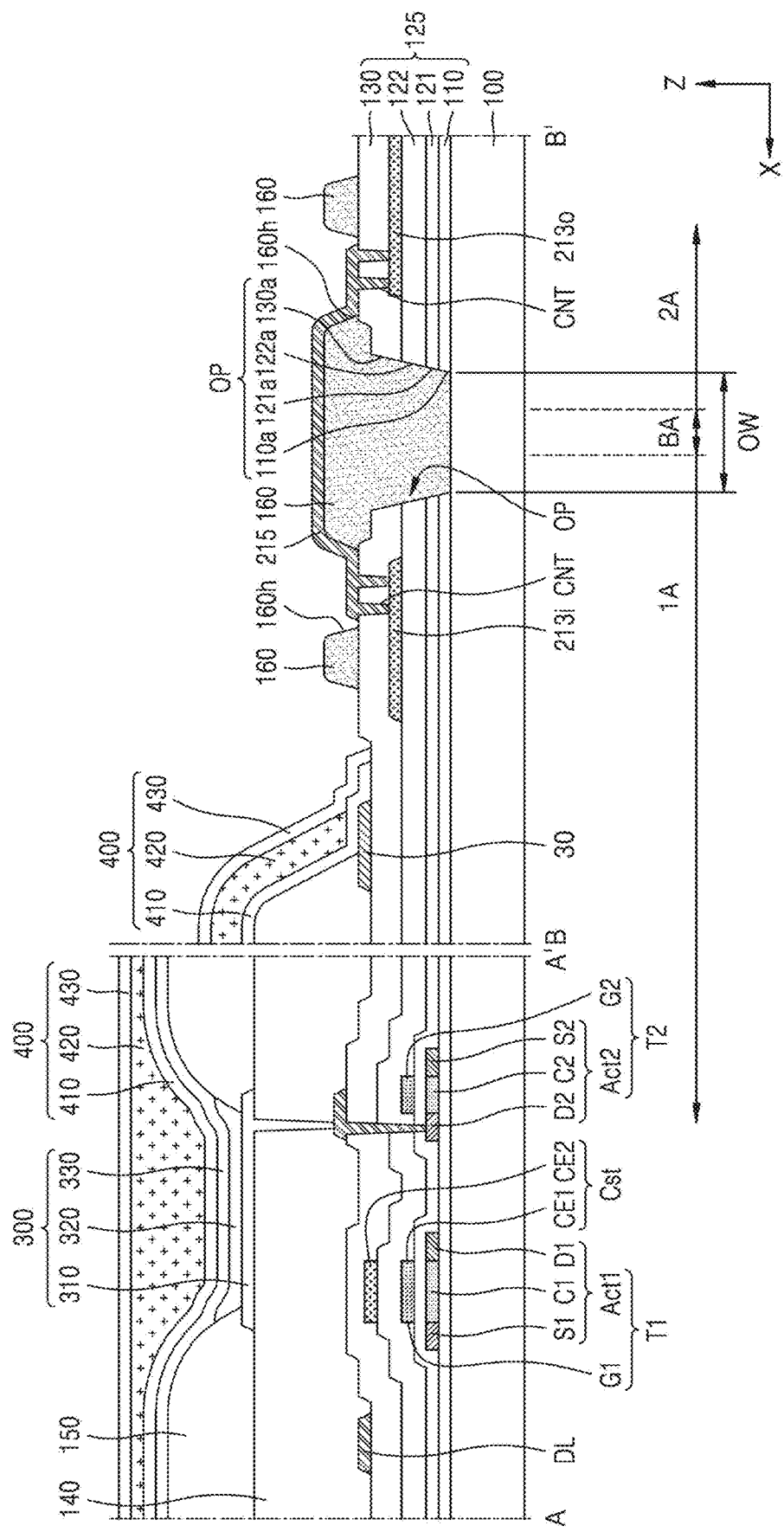
FIG. 4 shows cross-sectional views of portions of a display apparatus according to an alternative embodiment.
Figure 5:
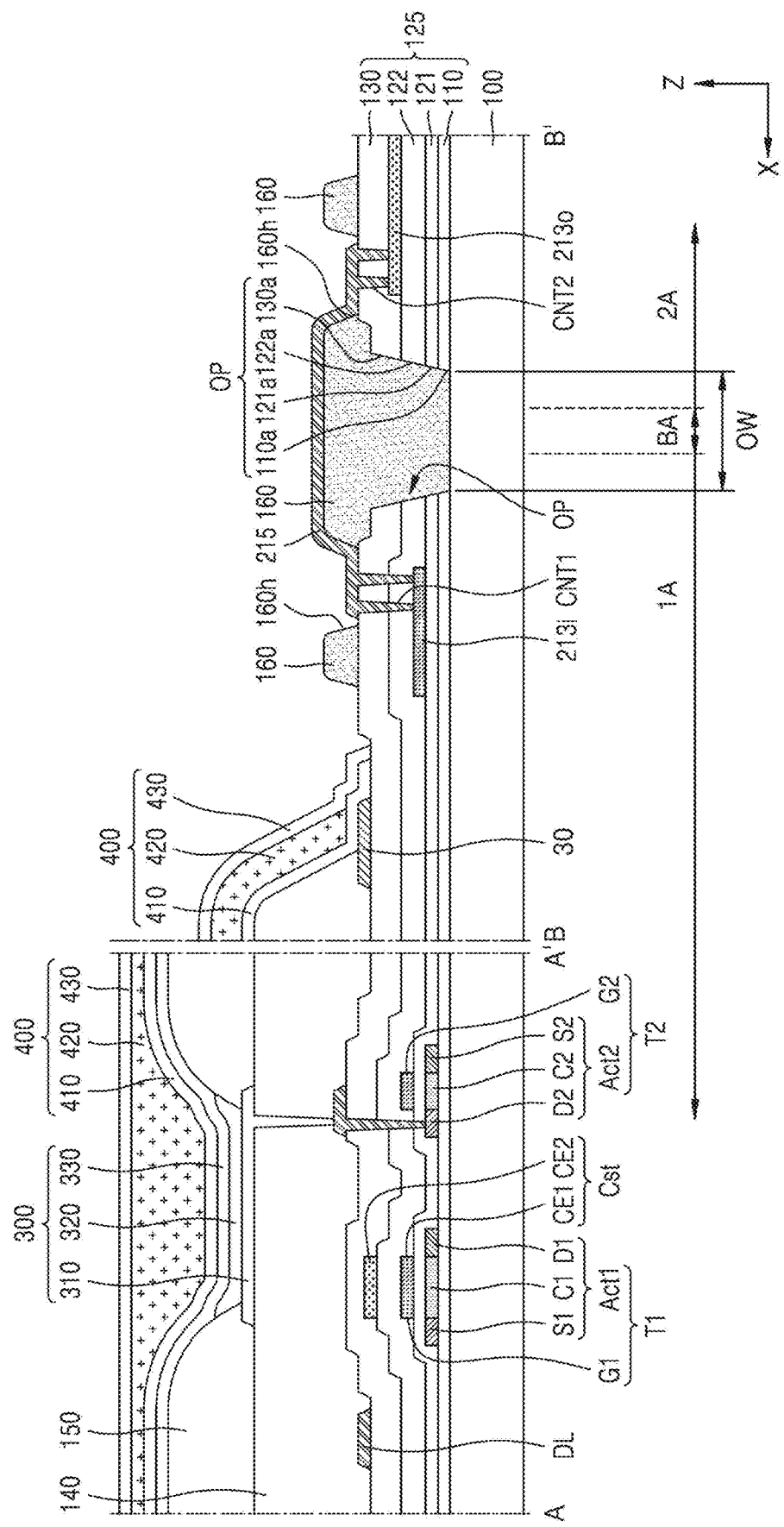
FIG. 5 shows cross-sectional views of portions of a display apparatus according to another alternative embodiment.

FIGS. 4 and 5 are cross-sectional views of portions of display apparatuses according to alternative embodiments. In FIGS. 4 and 5, the same reference numerals as those in FIG. 3 denote the same or like elements, and any repetitive detailed descriptions thereof will be omitted or simplified.

In an embodiment, as shown in FIG. 4, an internal conductive line 213*i* and an external conductive line 213*o* include a same material as a second storage capacitor plate CE2 and are positioned in a same layer as the second storage capacitor plate CE2, that is, on a second gate insulating layer 122.

A connection line 215 may contact the internal conductive line 213*i* and the external conductive line 213*o* via organic through-holes 160*h* defined in an organic material layer 160 and contact holes CNT defined through an interlayer insulating layer 130 and the second gate insulating layer 122. Each of the organic through-holes 160*h* exposes an upper surface of a portion of an inorganic insulating layer 125, and the contact holes CNT are defined in the portion of the organic through-holes 160*h*. In an embodiment, as shown in FIG. 3, two contact holes CNT may be arranged in one organic through-hole 160*h*, but the embodiment is not limited thereto. In such an embodiment, the number of contact holes CNT arranged in one organic through-hole 160*h* may be variously modified.

The internal conductive line 213*i* in a first area 1A may be electrically connected to the first and second TFTs T1 and T2 in the display area DA and/or the data line DL, and accordingly, the connection line 215 may be electrically connected to the first and second TFTs T1 and T2, etc. in the display area DA via the internal conductive line 213*i*. In an embodiment, the internal conductive line 213*i* may be connected, via a contact hole, to a conductive layer arranged in another layer in the display area DA, for example, a conductive layer on the interlayer insulating layer 130 or a conductive layer on the first gate insulating layer 121.

The external conductive line 213*o* in a second area 2A may be electrically connected to the first and second TFTs T1 and T2 in the display area DA and/or the data line DL via the connection line 215. In an embodiment, the external conductive line 213*o* may be connected, via a contact hole, to a conductive layer arranged in another layer in the second area 2A, for example, a conductive layer on the interlayer insulating layer 130 or a conductive layer on the first gate insulating layer 121.

In such an embodiment, the internal conductive line 213*i* and the external conductive line 213*o* may be electrically connected to components positioned in the display area DA, while being positioned outside the display area DA. In such an embodiment, the internal conductive line 213*i* and the external conductive line 213*o* may extend in a direction of the display area DA while being positioned outside the display area DA, and thus, at least portions of the internal and external conductive lines 213*i* and 213*o* may be in the display area DA.

Referring to FIG. 5, in an embodiment of the display apparatus, the internal conductive line 213*i* and the external conductive line 213*o*, connected to each other, may be arranged in different layers. FIG. 5 illustrates an embodiment where the internal conductive line 213*i* includes the same material as the first gate electrode G1 and is arranged in a same layer as the first gate electrode G1, and the external conductive line 213*o* includes a same material as the second storage capacitor plate CE2 and is arranged in a same layer as the second storage capacitor plate CE2. However, the embodiment is not limited thereto. In one alternative embodiment, for example, the internal conductive line 213*i* may include a same material as the second storage capacitor plate CE2 and may be arranged in a same layer as the second storage capacitor plate CE2, and the external conductive line 213*o* may include a same material as the first gate electrode G1 and may be arranged in a same layer as the first gate electrode G1.

The connection line 215 may contact the internal conductive line 213*i* via the organic through-hole 160*h* defined in the organic material layer 160 and the contact hole CNT1 defined through the interlayer insulating layer 130 and the second gate insulating layer 122, and may contact the external conductive line 213*o* via the organic through-hole 160*h* defined in the organic material layer 160 and the contact hole CNT2 defined through the interlayer insulating layer 130.

The internal conductive line 213*i* in a first area 1A may be electrically connected to first and second TFTs T1 and T2, etc. in the display area DA, and accordingly, the connection line 215 may be electrically connected to the first and second TFTs T1 and T2 in the display area DA and/or the data line DL via the internal conductive line 213*i*. In an embodiment, the internal conductive line 213*i* may be connected, via a contact hole, to a conductive layer arranged in another layer in the display area DA, for example, a conductive layer on the interlayer insulating layer 130 or a conductive layer on the second gate insulating layer 122.

The external conductive line 213*o* in the second area 2A may also be electrically connected to the first and second TFTs T1 and T2 in the display area DA and/or the data line DL via the connection line 215. In an embodiment, the external conductive line 213*o* may be connected, via a contact hole, to a conductive layer arranged in another layer in the second area 2A, for example, a conductive layer on the interlayer insulating layer 130 or a conductive layer on the first gate insulating layer 121.

In such an embodiment, the internal conductive line 213*i* and the external conductive line 213*o* may be electrically connected to components positioned in the display area DA, while being positioned outside the display area DA. In such an embodiment, the internal conductive line 213*i* and the external conductive line 213*o* may extend in a direction of the display area DA while being positioned outside the display area DA, and thus, at least portions of the internal and external conductive lines 213*i* and 213*o* may be in the display area DA.

In some embodiments, the arrangement of the internal conductive line 213*i* and the external conductive line 213*o* may be variously modified. In one embodiment, for example, some of a plurality of internal and external conductive lines 213*i* and 213*o* may include a same material as the first gate electrode G1 and may be arranged in a same layer as the first gate electrode G1, and the remaining of the plurality of internal and external conductive lines 213*i* and 213*o* may include a same material as the second storage capacitor plate CE2 and may be arranged in a same layer as the second storage capacitor plate CE2.

Figure 6:
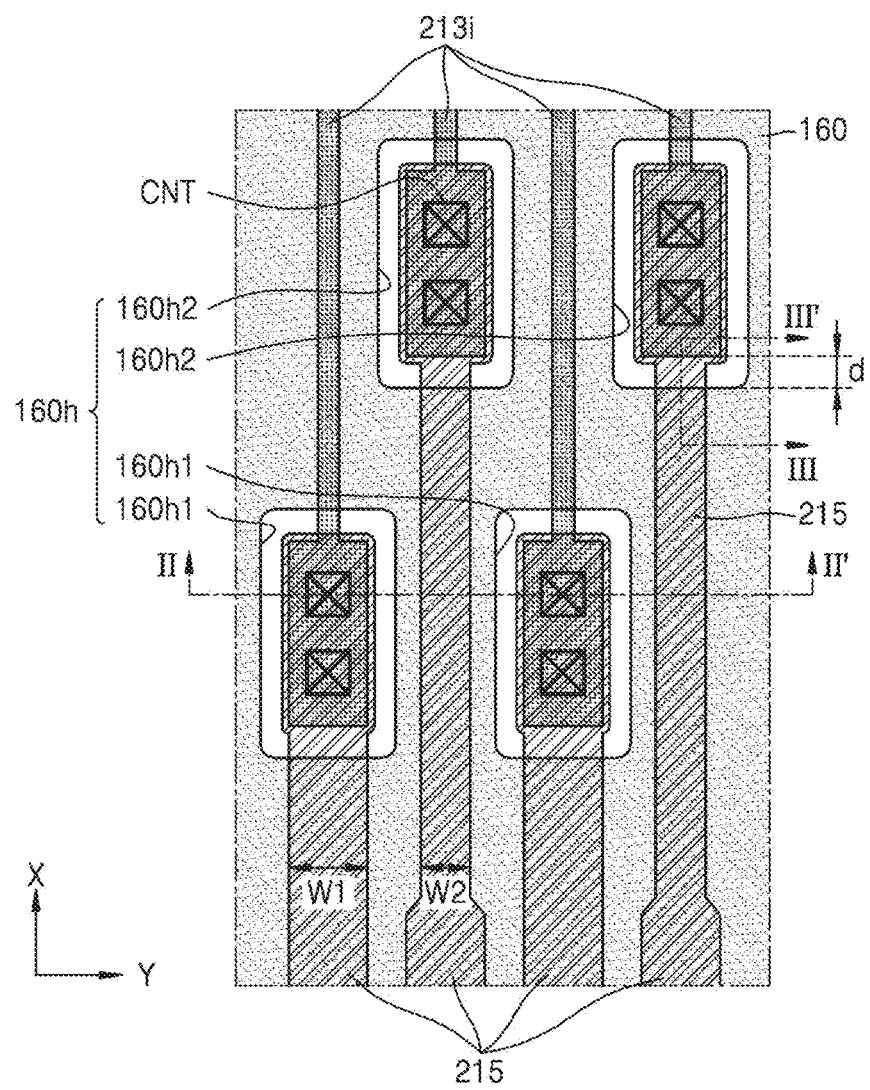
FIG. 6 is an enlarged plan view of a portion I of FIG. 2.
Figure 7:
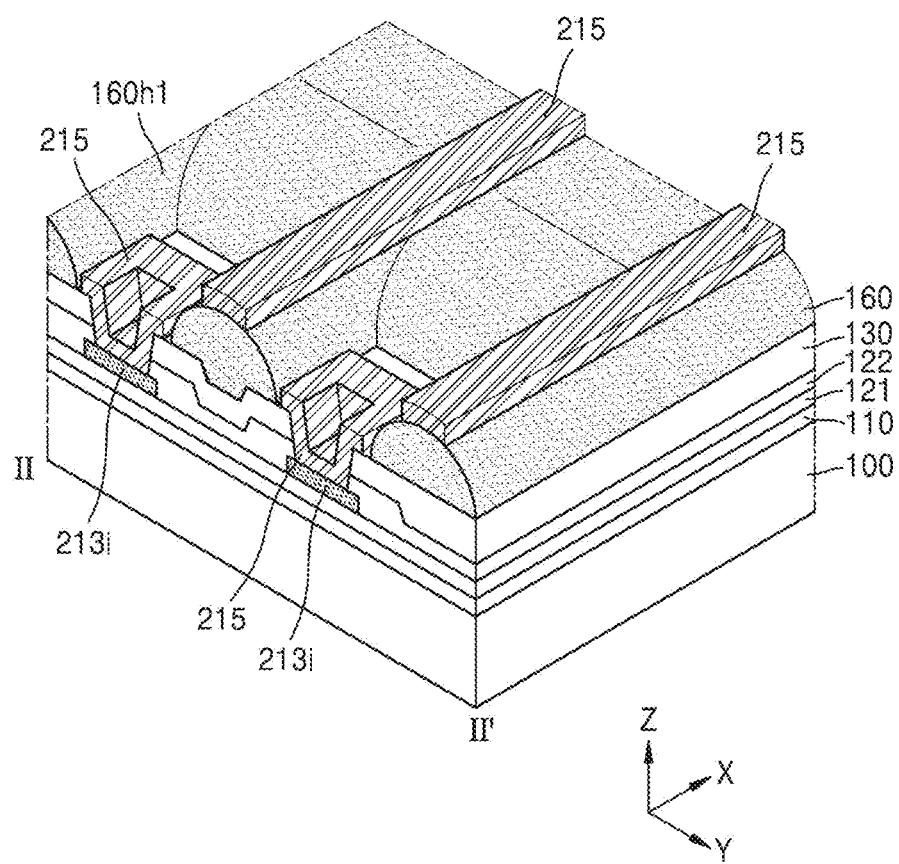
FIG. 7 is a cross-sectional perspective view taken along line II-II' of FIG. 6.
Figure 8:
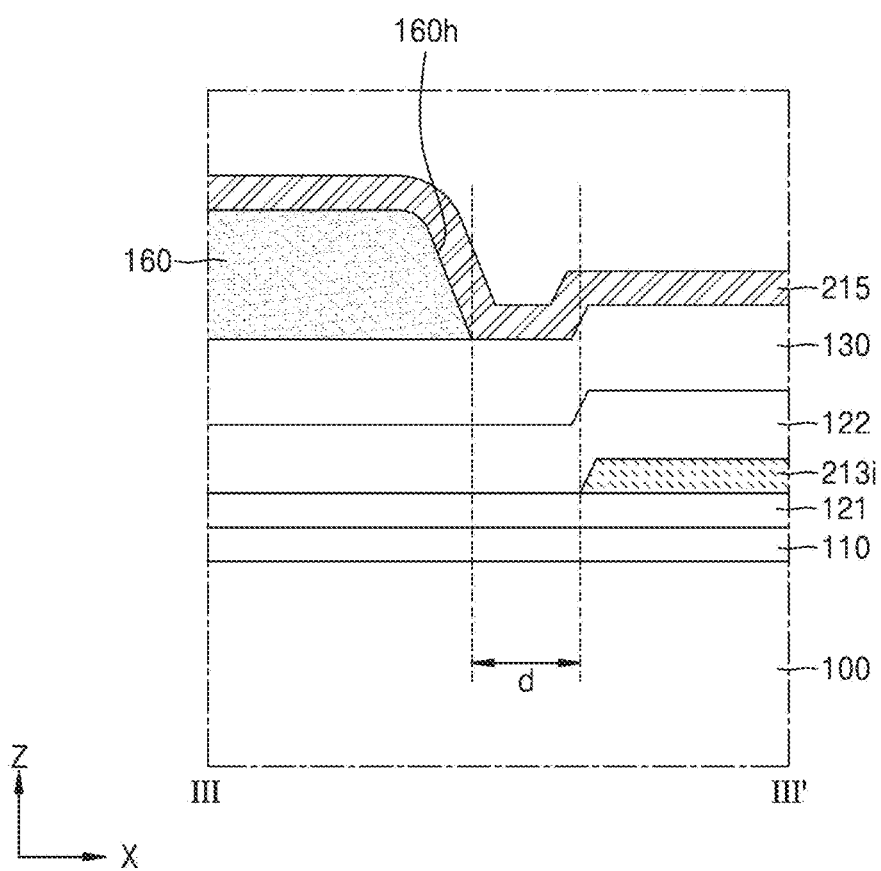
FIG. 8 is a cross-sectional view taken along line III-III' of FIG. 6.
Figure 9:
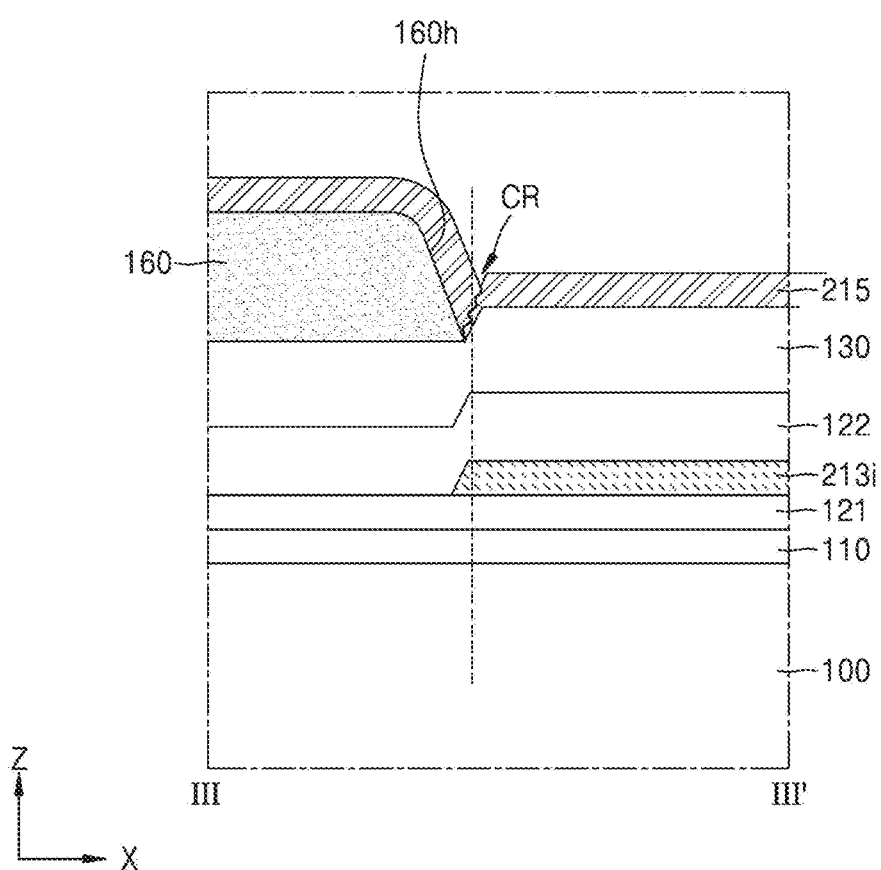
FIG. 9 is a cross-sectional view illustrating a portion of a comparative embodiment of a display apparatus.

FIG. 6 is an enlarged plan view of a portion I of FIG. 2. FIG. 7 is a cross-sectional perspective view taken along line II-II' of FIG. 6. FIG. 8 is a cross-sectional view taken along line III-III' of FIG. 6. FIG. 9 is a cross-sectional view showing a portion of a comparative embodiment of a display apparatus.

Referring to FIGS. 6 and 7, in an embodiment, the organic through-hole 160*h* includes a plurality of first organic through-holes 160*h*1 arranged in a first direction (+Y direction). In such an embodiment, the organic through-hole 160*h* may further include a plurality of second organic through-holes 160*h*2 which are not collinear with the first organic through-holes 160*h*1 in the X direction. Accordingly, the first organic through-holes 160*h*1 and the second organic through-holes 160*h*2 are not arranged linearly on a same line but are staggered relative to each other. Since the first organic through-holes 160*h*1 and the second organic through-holes 160*h*2 are staggered relative to each other, more organic through-holes 160*h* may be arranged in a limited space having a small width in the X direction. Accordingly, a large number of contact areas through which the connection line 215 and the internal and external conductive lines 213*i* and 213*o* are connected may be arranged in a narrow space, and thus, the interval between the connection lines 215 may be reduced.

In such an embodiment, since the first organic through-holes 160*h*1 and the second organic through-holes 160*h*2 are staggered relative to each other, a portion of the connection line 215 may pass between the first organic through-holes 160*h*1. Thus, the width of the connection line 215 may be variously modified. In one embodiment, for example, a width W2 of a portion of the connection line 215 passing between the first organic through-holes 160*h*1 may be less than a width W1 of the connection line 215 connecting the second organic through-holes 160*h*2.

The number of the first organic through-holes 160*h*1 and the number of the second organic through-holes 160*h*2 may be different from each other. In an embodiment, as shown in FIG. 6, two contact holes CNT connecting the connection line 215 to the internal conductive line 213*i* are provided in the first organic through-hole 160*h*1 or the second organic through-hole 160*h*2. However, the number of the contact holes CNT is not limited thereto. The number of the contact holes CNT arranged in the first organic through-hole 160*h*1 may be different from the number of the contact holes CNT arranged in the second organic through-hole 160*h*2.

Referring to FIG. 7, in an embodiment, an upper surface (+Z direction) of the organic material layer 160 arranged between the first organic through-holes 160*h*1 has a convex curved form. The upper surface of the organic material layer 160 may have a curved surface and have a height that is largest in the middle and gradually decreases toward the first organic through-holes 160*h*1. In such an embodiment, the upper surface of the organic material layer 160 arranged between the first organic through-holes 160*h*1 is not flat.

According to embodiments, adjacent first organic through-holes 160*h*1 may be close to each other, and the upper surface of the organic material layer 160 arranged therebetween may have a convex curved surface such that a large number of connection lines 215, a large number of internal conductive lines 213*i*, and a large number of external conductive lines 213*o* are allowed to be arranged in a narrow space. The closer adjacent first organic through-holes 160*h*1 are to each other, the smaller a radius of curvature of the upper surface of the organic material layer 160 arranged therebetween.

In an embodiment, the connection line 215 may be arranged on the upper surface of the organic material layer 160 arranged between the first organic through-holes 160*h*1. In such an embodiment, the connection line 215 may have a curved surface in the width direction (±Y direction), corresponding to the shape of the upper surface of the organic material layer 160.

Referring to FIGS. 6 and 8, an end of the connection line 215 may be arranged in the organic through-hole 160*h*. an end of the internal conductive line 213*i* may overlap the inside of the organic through-hole 160*h*, and thus, the end of the connection line 215 and the end of the internal conductive line 213*i* may be electrically connected to each other via a contact hole CNT defined through the interlayer insulating layer 130 and the second gate insulating layer 122.

In an embodiment, the organic through-hole 160*h* exposes the upper surface of the interlayer insulating layer 130, and a portion of the connection line 215 is arranged on the interlayer insulating layer 130 in the organic through-hole 160*h*. In such an embodiment, the connection line 215 extends from the upper surface of the organic material layer 160 to the upper surface of the interlayer insulating layer 130 in the organic through-hole 160*h*. In such an embodiment, the connection line 215 may be subjected to stress depending on the shape of a structure under the connection line 215. In an embodiment, a lower edge of the organic through-hole 160h and one end of the internal conductive line 213i are horizontally spaced apart from each other not to overlap each other such that stress which the connection line 215 may receive in a contact area is substantially reduced.

If a lower edge of the organic through-hole 160h and one end of the internal conductive line 213i overlap each other as in a comparative embodiment shown in FIG. 9 corresponding to FIG. 8, a step formed in inorganic insulating layers, such as the second gate insulating layer 122 arranged on the internal conductive line 213i and the interlayer insulating layer 130, and a boundary of the organic material layer 160 are close to each other, and thus, a structure under the connection line 215 forms many steps. As a result, the probability of a crack CR forming, due to an influence of the steps, is relatively high in the connection line 215 passing over the structure.

In an embodiment, as described above, an end of the internal conductive line 213i may be arranged not to overlap a lower edge of the organic through-hole 160h, thereby effectively preventing the formation of a crack in the connection line 215. In an embodiment, as shown in FIGS. 6 and 8, a distance d between the lower edge of the organic through-hole 160h and an end of the internal conductive line 213i may be in a range of about 4 micrometers (μm) to about 8 μm.

Figure 10:
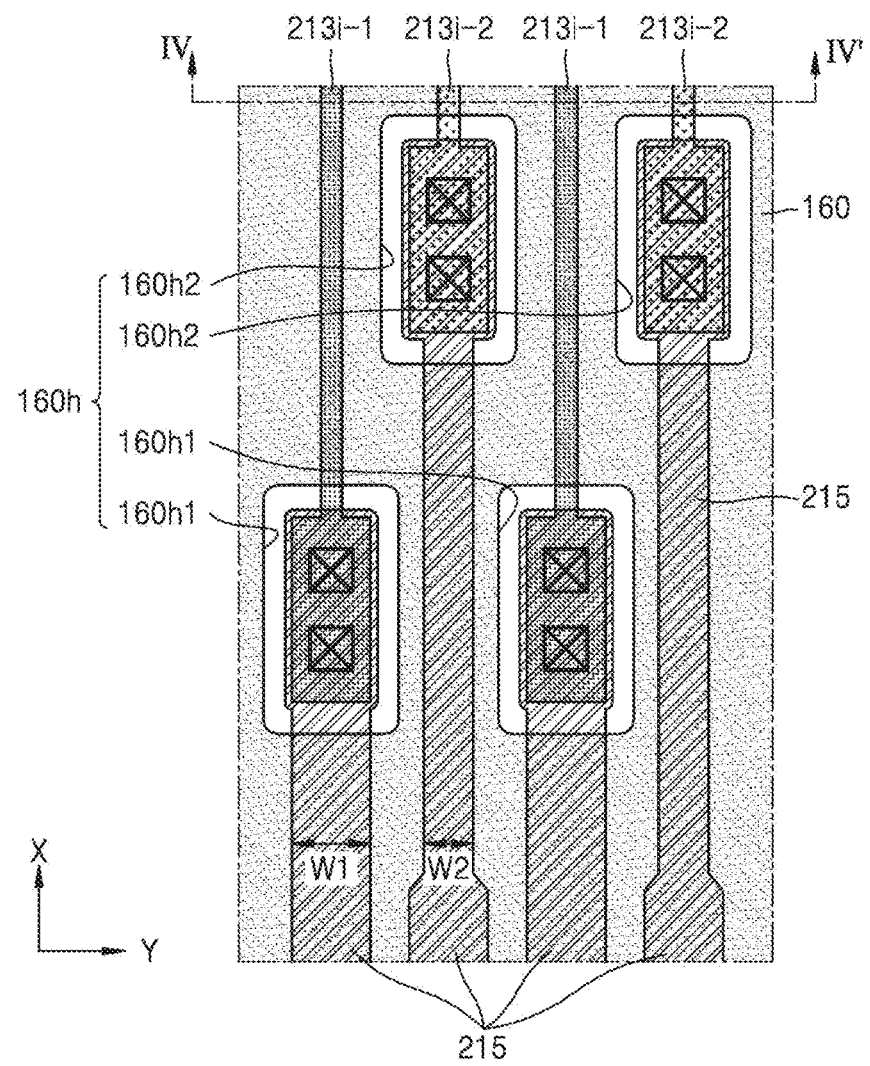
FIG. 10 is a plan view of a portion of a display apparatus according to an alternative embodiment.
Figure 11:
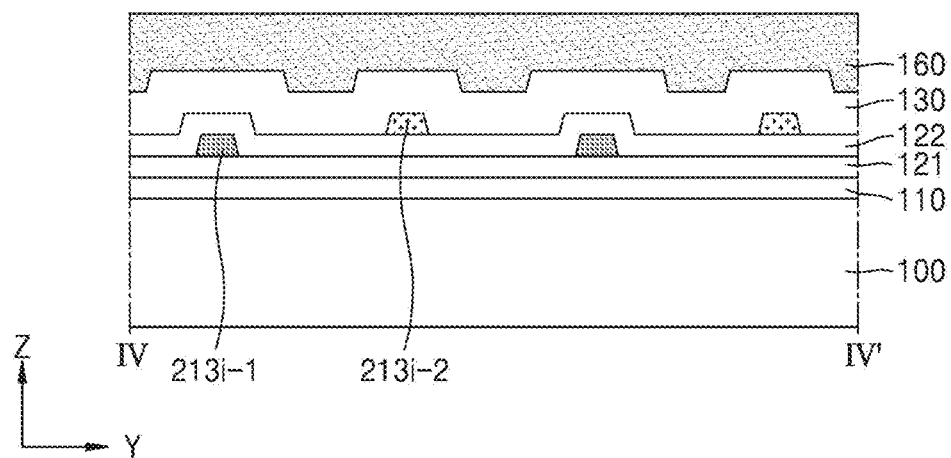
FIG. 11 is a cross-sectional view taken along line IV-IV' of FIG. 10.

FIG. 10 is a plan view of a portion of a display apparatus according to an alternative embodiment, which shows an area corresponding to the portion I of FIG. 2. FIG. 11 is a cross-sectional view taken along line IV-IV' of FIG. 10.

Referring to FIGS. 10 and 11, in an embodiment, internal conductive lines 213i may include first internal conductive lines 213i-1 and second internal conductive lines 213i-2, arranged in different layers. In such an embodiment, the first internal conductive lines 213i-1 may be arranged on the first gate insulating layer 121, and may include (e.g., be formed of) a same material as the first gate electrode G1, in a same layer as the first gate electrode G1. In such an embodiment, the second internal conductive lines 213i-2 may be arranged on the second gate insulating layer 122, and may include a same material as the second storage capacitor plate CE2, in a same layer as the second storage capacitor plate CE2. In an embodiment, as shown in FIGS. 10 and 11, the first internal conductive lines 213i-1 and the second internal conductive lines 213i-2 may be alternately arranged. However, the embodiment is not limited thereto. In such an embodiment, the arrangement order of the first internal conductive lines 213i-1 and the second internal conductive lines 213i-2 may be variously modified.

In an embodiment, as shown in FIG. 11, the first internal conductive lines 213i-1 and the second internal conductive lines 213i-2 are insulated from each other by the second gate insulating layer 122 therebetween, and are in different layers from each other. The first internal conductive lines 213i-1 and the second internal conductive lines 213i-2 may be arranged not to overlap each other to reduce parasitic capacitance that may occur between the first internal conductive lines 213i-1 and the second internal conductive lines 213i-2. In an alternative embodiment, the first internal conductive lines 213i-1 and the second internal conductive lines 213i-2 may be arranged to overlap each other at least partially.

In an embodiment, the external conductive lines 213o (see FIG. 2) may include first external conductive lines and second external conductive lines, arranged in different layers from each other. In such an embodiment, the first external conductive lines may be arranged on the first gate insulating layer 121, and may include a same material as the first gate electrode G1, in a same layer as the first gate electrode G1. In such an embodiment, the second external conductive lines may be arranged on the second gate insulating layer 122, and may include of a same material as the second storage capacitor plate CE2, in a same layer as the second storage capacitor plate CE2. In an embodiment, the first external conductive lines and the second external conductive lines may be alternately arranged. However, the embodiment is not limited thereto. In such an embodiment, the arrangement order of the first external conductive lines and the second external conductive lines may be variously modified.

The first external conductive lines and the second external conductive lines are insulated from each other by the second gate insulating layer 122 therebetween, and are in different layers from each other. In an embodiment, the first external conductive lines and the second external conductive lines may be arranged not to overlap each other. However, in an alternative embodiment, the first external conductive lines and the second external conductive lines may be arranged to overlap each other at least partially.

FIG. 12 is a cross-sectional view of portions of a display apparatus according to another alternative embodiment. In FIG. 12, the same reference numerals as those in FIG. 3 denote the same or like elements, and any repetitive detailed descriptions thereof will be omitted.

Referring to FIG. 12, in an embodiment, a display area DA includes a first planarization layer 141 covering the drain electrode SD and the data line DL and arranged on the interlayer insulating layer 130, a conductive layer PL arranged on the first planarization layer 141, and a second planarization layer 142 covering the conductive layer PL and arranged on the first planarization layer 141. The connection line 215 may include or be formed of a same material as the data line DL or the conductive layer PL, simultaneously with the data line DL or the conductive layer PL.

The first and second planarization layers 141 and 142, which are insulating layers, may include an organic material. The organic material may include at least one of an imide polymer, a general purpose polymer such as polymethylmethacrylate ("PMMA") or polystyrene ("PS"), a polymer derivative having a phenolic group, an acrylic polymer, an arylether polymer, an amide polymer, a fluorine polymer, a p-xylene polymer, a vinyl alcohol polymer, and a combination (e.g., blend) thereof. The first planarization layer 141 and the second planarization layer 142 may include an inorganic material such as silicon oxide, silicon nitride, and/or silicon oxynitride. Alternatively, the first planarization layer 141 may include an inorganic material, and the second planarization layer 142 may include an organic material. The first planarization layer 141 and the second planarization layer 142 may have a single layered or multi-layered structure.

The conductive layer PL arranged on the first planarization layer 141 may function as a voltage line for transmitting a power supply voltage or a data line for transmitting a data signal. The conductive layer PL arranged on the first planarization layer 141 may be connected to the data line DL through a contact hole defined in the first planarization layer 141. The conductive layer PL may include molybdenum (Mo), aluminum (Al), copper (Cu), titanium (Ti), and the like, and may have a single layered or multi-layered structure. The conductive layer PL may have a higher elongation percentage than the first and second gate electrodes G1 and G2 or the second storage capacitor plate CE2.

In an embodiment, the connection line 215 may include or be formed of a same material as the conductive layer PL, simultaneously with the conductive layer PL. However, the embodiment is not limited thereto. In one alternative embodiment, for example, the connection line 215 may be formed of a same material as the data line DL, simultaneously with the data line DL arranged on the interlayer insulating layer 130. Alternatively, some of the connection lines 215 may be formed of a same material as the conductive layer PL, simultaneously with the conductive layer PL, and the remaining connection lines 215 may be formed of a same material as the data line DL, simultaneously with the data line DL.

In an embodiment, where the connection line 215 is formed of a same material as the conductive layer PL and simultaneously with the conductive layer PL, the organic material layer 160 may be formed of a same material as the first planarization layer 141, simultaneously with the first planarization layer 141. In such an embodiment, since the organic material layer 160 may be formed simultaneously with the first planarization layer 141, a process of manufacturing the display apparatus may be simplified.

Figure 13:
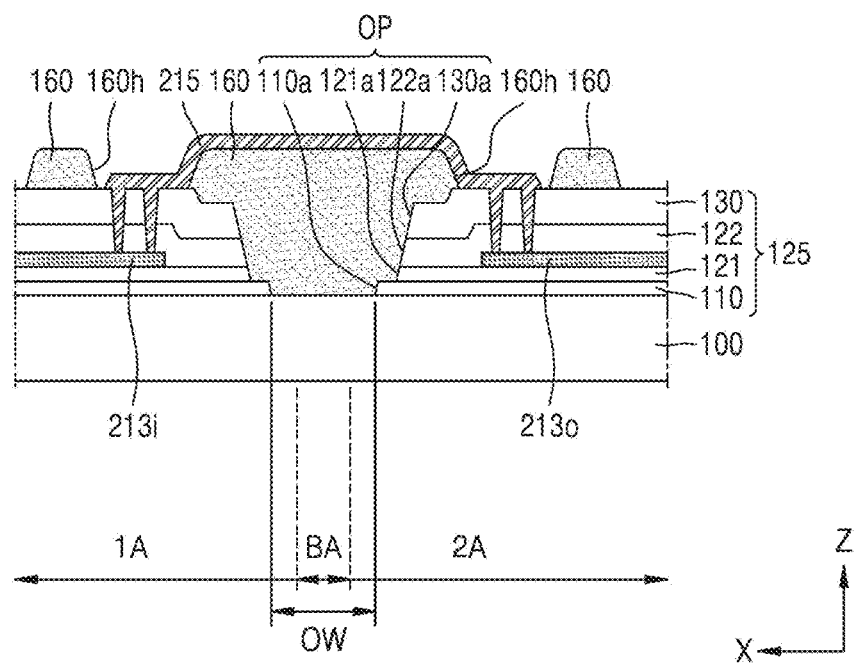
FIG. 13 is a cross-sectional view of a portion of a display apparatus according to another embodiment.

FIG. 13 is a cross-sectional view of a portion of a display apparatus according to another alternative embodiment. More particularly, FIG. 13 is a cross-sectional view schematically illustrating the vicinity of a bending area BA.

Referring to FIG. 13, in an embodiment, an inner surface of the opening OP in the inorganic insulating layer 125 may have a stepped form. In such an embodiment, as shown in FIG. 13, the area of the opening 121a in the first gate insulating layer 121 may be larger than the area of the opening 110a in the buffer layer 110, and thus, the inner surface of the opening OP in the inorganic insulating layer 125 may have a stepped form. Although not shown in FIG. 13, the inner surface of the opening OP in the inorganic insulating layer 125 may have a stepped form due to a difference between the area of the opening 121a in the first gate insulating layer 121 and the area of the opening 122a in the second gate insulating layer 122, and a difference between the area of the opening 122a in the second gate insulating layer 122 and the area of the opening 130a in the interlayer insulating layer 130.

Figure 14:
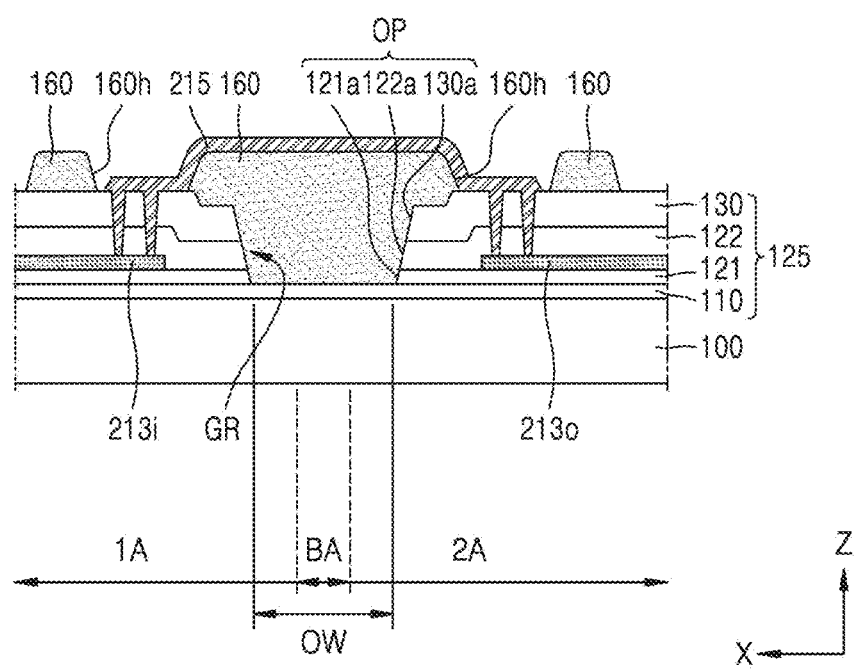
FIG. 14 is a cross-sectional view of a portion of a display apparatus according to another embodiment.

FIG. 14 is a cross-sectional view of a portion of a display apparatus according to another alternative embodiment. More particularly, FIG. 14 is a cross-sectional view schematically illustrating the vicinity of the bending area BA.

Referring to FIG. 14, in an embodiment, the inorganic insulating layer 125 may have a groove corresponding to a bending area BA. The groove may denote an area where the inorganic insulating layer 125 is partially removed in a downward direction (−z direction) and a portion thereof remains. In one embodiment, for example, the buffer layer 110 may extend continuously over the first area 1A, the bending area BA and the second area 2A. In an embodiment, the opening 121a is defined in the first gate insulating layer 121 to correspond to the bending area BA, the opening 122a is defined in the second gate insulating layer 122 to correspond to the bending area BA, and the opening 130a is defined in the interlayer insulating layer 130 to correspond to the bending area BA. Accordingly, in such an embodiment, the inorganic insulating layer 125 including the buffer layer 110, the first gate insulating layer 121, the second gate insulating layer 122 and the interlayer insulating layer 130 has a groove GR corresponding to the bending area BA. In an embodiment, the inorganic insulating layer 125 may also include the groove GR in any one of various forms. In one embodiment, for example, a portion of the upper surface of the buffer layer 110 may also be removed, or the bottom surface of a gate insulating layer, e.g., the first gate insulating layer 121 or the second gate insulating layer 122, may remain without being removed.

In an embodiment, where the groove GR corresponds to the bending area BA, the groove GR may overlap the bending area BA. In such an embodiment, the area of the groove GR may be larger than the area of the bending area BA. In such an embodiment, as shown in FIG. 13, the width OW of the groove GR is greater than the width of the bending area BA. Here, the area of the groove GR may be defined as the area of an opening with the smallest area among the opening 121a of the first gate insulating layer 121, the opening 122a of the second gate insulating layer 122, and the opening 130a of the interlayer insulating layer 130.

In an embodiment, since the hardness of the inorganic insulating layer 125 is greater than that of an organic material layer 160, the probability of crack formation in the inorganic insulating layer 125 in the bending area BA is very high. When a crack forms in the inorganic insulating layer 125, the probability of crack propagation to a connection line 215 increases. Accordingly, in an embodiment, by forming a groove in the inorganic insulating layer 125, the probability of crack formation in the inorganic insulating layer 125 may be lowered. The organic material layer 160 having a stress buffering function is arranged in the groove GR, and thus, formation of a crack in the connection line 215 may be effectively prevented by forming the groove GR without forming an opening in the inorganic insulating layer 125 in the bending area BA.

In an embodiment, the organic material layer 160 may be provided to correspond to the bending area BA, without forming an opening or a groove in the inorganic insulating layer 125. In such an embodiment, concentration of tensile stress on the connection line 215 may be effectively prevented by the organic material layer 160.

Figure 15A:
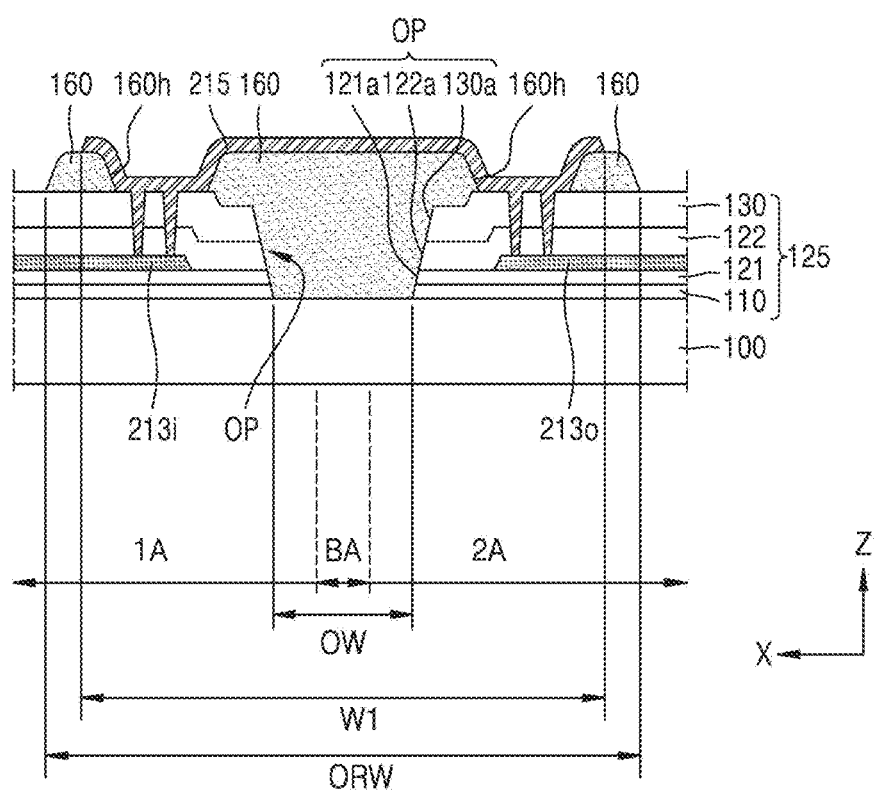
FIGS. 15A and 15B are cross-sectional views of portions of display apparatuses according to other embodiments.
Figure 15B:
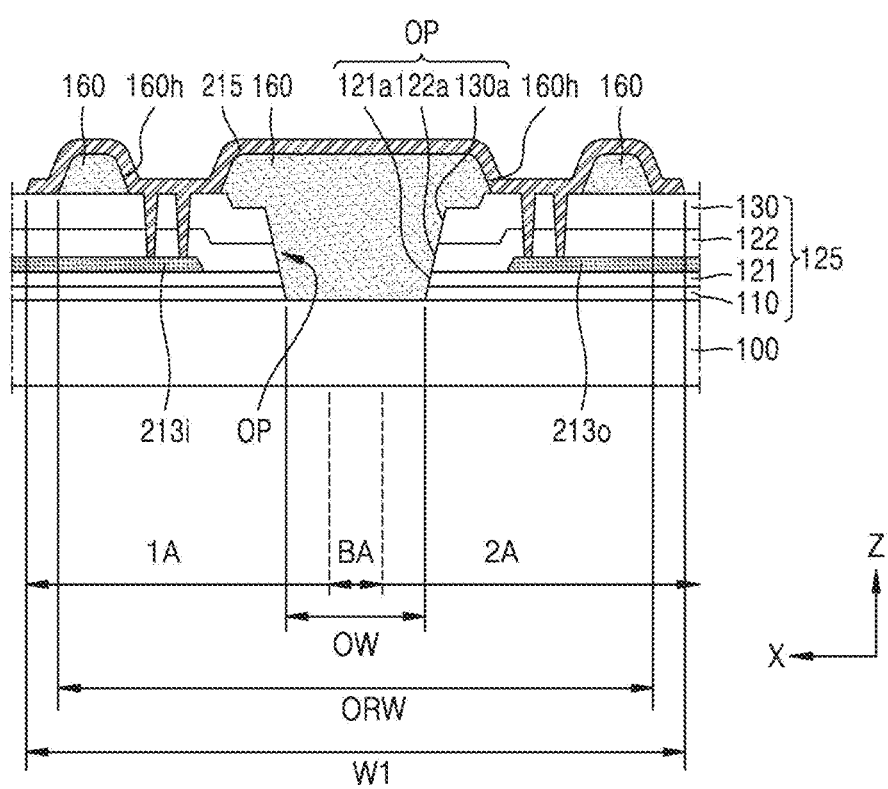

FIGS. 15A and 15B are cross-sectional views of portions of display apparatuses according to other alternative embodiments. More particularly, FIGS. 15A and 15B are cross-sectional views schematically illustrating the vicinity of a bending area BA.

In embodiments described above with reference to FIGS. 2 to 14, an end of the connection line 215 is arranged in the organic through-hole 160h, but the invention is not limited thereto. In one alternative embodiment, for example, as shown in FIG. 15A, an end of the connection line 215 may extend inside the organic through-hole 160h and may be arranged on the upper surface of the organic material layer 160. In such an embodiment, the width W1 of the connection line 215 in the second direction (X direction) may be smaller than a width ORW of the organic material layer 160.

In another alternative, as shown in FIG. 15B, the width W1 of the connection line 215 in the second direction (X direction) may be greater than the width ORW of the organic material layer 160. In such an embodiment, the connection line 215 may extend inside the organic through-hole 160h and across the upper surface of the inorganic insulating layer 125 and the upper surface of the organic material layer 160.

In embodiments of the invention, various modifications may be made in a way such that one end of the connection line 215 is arranged in the organic through-hole 160h and the other end of the connection line 215 is arranged in the organic through-hole 160h and on the upper surface of the organic material layer 160.

Figure 16:
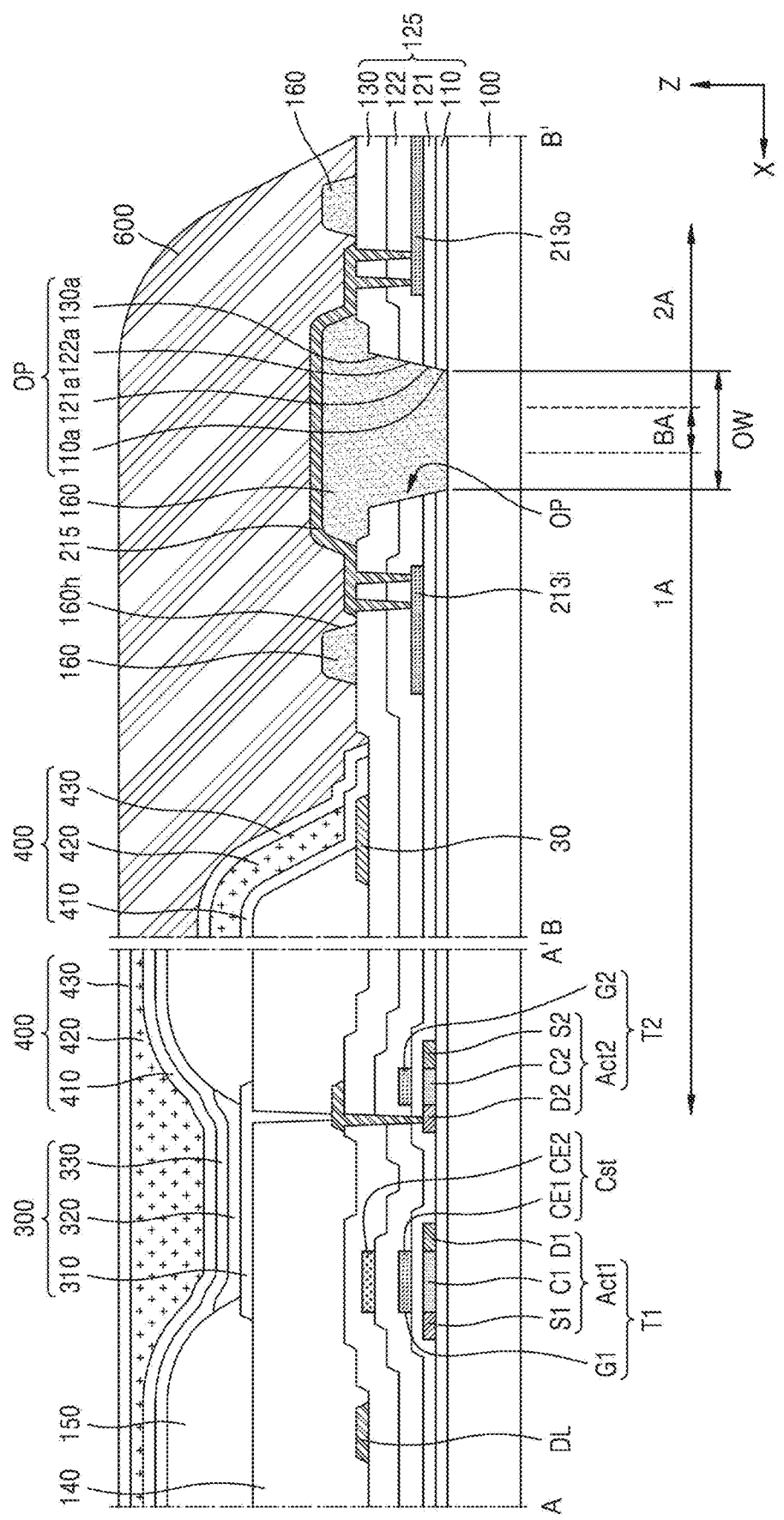
FIG. 16 is a cross-sectional view of portions of a display apparatus according to another alternative embodiment.

FIG. 16 is a cross-sectional view of portions of a display apparatus according to another alternative embodiment. In FIG. 16, the same reference numerals as those in FIG. 3 denote the same or like elements, and any repetitive detailed descriptions thereof will be omitted.

Referring to FIG. 16, in an embodiment, a bending protective layer 600 may be formed on the upper surface of the substrate 100 to overlap the bending area BA. The bending protective layer 600 may be positioned on the connection line 215 to correspond to the bending area BA. When a stacked structure is bent, a stress neutral plane is present in the stacked structure. If the bending protective layer 600 is not present, excessive tensile stress may be applied to the connection line 215 in the bending area BA, according to bending of the substrate 100 or the like as described later because the position of the connection line 215 may not correspond to the stress neutral plane. In an embodiment, by allowing the bending protective layer 600 to be present and by controlling a thickness and a modulus of the bending protective layer 600, the position of a stress-neutral plane may be adjusted in a stacked structure including the substrate 100, the connection line 215 and the bending protective layer 600. Therefore, by positioning the stress neutral plane in the vicinity of the connection line 215 through the bending protective layer 600, tensile stress applied to the connection line 215 may be reduced so as to protect the bending area BA. The bending protective layer 600 may be formed by coating a liquid or paste material and curing the material.

Hereinabove, various embodiments have been described. Such embodiments may be implemented as separate embodiments, or combined with each other. For example, various combinations may be possible such that an embodiment related to a positional relationship between the internal conductive line 213*i* and the external conductive line 213*o*, described with reference to FIGS. 4 and 5, may be applied to an embodiment in which a groove is formed in the inorganic insulating layer 125, described with reference to FIG. 14.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate on which a first area, a second area, and a bending area between the first area and the second area are defined, wherein the substrate is bent around a bending axis extending in a first direction;
   a display element arranged in the first area;
   an encapsulation layer disposed on the display element; and
   an organic material layer disposed on the bending area, the organic material includes at least one organic through-hole;
   a first line disposed on the first area;
   a second line disposed on the second area; and
   a connection line disposed on the organic material layer at the bending area;
   wherein the connection line is respectively connected the first line and the second line through the at least one organic though-hole,
   wherein the encapsulation layer and the organic material layer are spaced apart from each other.

2. The display apparatus of claim 1, wherein
   the at least one organic through-hole comprises a plurality of first organic through-holes arranged in the first direction, and
   an upper surface of the organic material layer located between the plurality of first organic through-holes has a convex curved shape.

3. The display apparatus of claim 2, wherein
   a portion of the connection line is on the upper surface of the organic material layer having the convex curved shape, and
   the connection line extends across the bending area.

4. The display apparatus of claim 1, wherein
   the encapsulation layer comprises a first inorganic layer, a second inorganic layer and, an organic layer,
   the organic layer of the encapsulation layer is disposed between the first inorganic layer and the second inorganic layer.

5. The display apparatus of claim 1, wherein
   an end of the first line overlaps an inside of the at least one organic through-hole.

6. The display apparatus of claim 1, wherein an elongation percentage of the connection line is greater than an elongation percentage of the first line and an elongation percentage of the second line.

7. The display apparatus of claim 1, further comprising:
   a thin film transistor in the first area or the second area, wherein the thin film transistor comprises a semiconductor layer and a gate electrode which are insulated from each other by a first gate insulating layer,
   wherein the first line comprise a same material as the gate electrode and is disposed in a same layer as the gate electrode.

8. The display apparatus of claim 1, further comprising:
   an inorganic insulating layer, wherein an opening or a groove defined by the inorganic insulating layer corresponds to the bending area,
   wherein the organic material layer fills the opening or the groove and extends to an upper surface of the inorganic insulating layer.

9. The display apparatus of claim 8, wherein
   the at least one organic through-hole expose the inorganic insulating layer, and
   the connection line is respectively connected to the first line and the second line via contact holes defined in the inorganic insulating layer.

10. The display apparatus of claim 8, wherein the first line and the second line are spaced apart from each other with the opening or the groove of the inorganic insulating layer therebetween.

11. A display apparatus comprising:
    a substrate on which a first area, a second area, and a bending area between the first area and the second area are defined, wherein the substrate is bent around a bending axis extending in a first direction;
    a display element arranged in the first area;
    an encapsulation layer disposed on the display element and comprising an organic layer; and
    an organic material layer disposed on the bending area, the organic material includes at least one organic through-hole;
    wherein the organic layer of the encapsulation layer and the organic material layer are spaced apart from each other.

12. The display apparatus of claim 11, wherein
the at least one organic through-hole comprises a plurality of first organic through-holes arranged in the first direction, and
an upper surface of the organic material layer located between the plurality of first organic through-holes has a convex curved shape.

13. The display apparatus of claim 11, wherein
the encapsulation layer further comprises a first inorganic layer and a second inorganic layer,
the organic layer of the encapsulation layer is disposed between the first inorganic layer and the second inorganic layer, and
the encapsulation layer and the organic material layer are spaced apart from each other.

14. The display apparatus of claim 11, further comprising:
an inorganic insulating layer, wherein an opening or a groove corresponding to the bending area,
wherein the organic material layer fills the opening or the groove and extends to an upper surface of the inorganic insulating layer.

15. The display apparatus of claim 11, further comprising:
a first line disposed on the first area;
a second line disposed on the second area; and
a connection line disposed on the organic material layer at the bending area;
wherein the connection line is respectively connected to the first line and the second line.

\* \* \* \* \*